(12) United States Patent
Jung et al.

(10) Patent No.: US 10,312,191 B2
(45) Date of Patent: Jun. 4, 2019

(54) INTEGRATED CIRCUIT DEVICES INCLUDING A VERTICAL MEMORY DEVICE

(71) Applicant: Samsung Electronics Co., Ltd., Suwon-si, Gyeonggi-do (KR)

(72) Inventors: Young-jin Jung, Hwaseong-si (KR); Joon-hee Lee, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/923,737

(22) Filed: Mar. 16, 2018

(65) Prior Publication Data

US 2019/0027434 A1 Jan. 24, 2019

(30) Foreign Application Priority Data

Jul. 21, 2017 (KR) .................. 10-2017-0092733

(51) Int. Cl.
*H01L 23/528* (2006.01)
*H01L 27/11582* (2017.01)
*H01L 27/11556* (2017.01)

(52) U.S. Cl.
CPC ...... *H01L 23/528* (2013.01); *H01L 27/11556* (2013.01); *H01L 27/11582* (2013.01)

(58) Field of Classification Search
CPC ............. H01L 23/528; H01L 27/11582; H01L 27/11556
See application file for complete search history.

(56) References Cited

U.S. PATENT DOCUMENTS

| 9,165,941 | B2 | 10/2015 | Yang et al. |
| 9,324,730 | B2 | 4/2016 | Nam et al. |
| 9,331,090 | B2 | 5/2016 | Alsmeier et al. |
| 9,425,207 | B2* | 8/2016 | Yasuda ................. G11C 16/14 |
| 9,449,986 | B1* | 9/2016 | Yoon ................. H01L 27/11582 |
| 9,530,789 | B2 | 12/2016 | Lee et al. |
| 9,543,316 | B2 | 1/2017 | Lee et al. |
| 9,768,115 | B2* | 9/2017 | Choi ..................... H01L 23/528 |
| 9,786,637 | B2* | 10/2017 | Sasano ............... H01L 25/0753 |
| 9,929,174 | B1* | 3/2018 | Mizutani ............ H01L 27/1157 |
| 2003/0111707 | A1 | 6/2003 | Takaura et al. |
| 2004/0114424 | A1 | 6/2004 | Yoshida |
| 2017/0040338 | A1 | 2/2017 | Lee et al. |
| 2017/0373084 | A1* | 12/2017 | Shim ................. H01L 27/11565 |

FOREIGN PATENT DOCUMENTS

KR      1020090106877 A     10/2009

* cited by examiner

*Primary Examiner* — William Coleman
(74) *Attorney, Agent, or Firm* — Myers Bigel, P.A.

(57) ABSTRACT

Provided is an integrated circuit device including a plurality of word lines overlapping each other, in a vertical direction, on a substrate, a plurality of channel structures extending in the vertical direction through the plurality of word lines on an area of the substrate, a plurality of bit line contact pads on the plurality of channel structures, and a plurality or bit lines, wherein the plurality of bit lines include a plurality of first bit lines extending parallel to each other at a first pitch in a center region of the area, and a plurality of second bit lines extending at a second pitch in an edge region of the area, the second pitch being different from the first pitch.

20 Claims, 23 Drawing Sheets

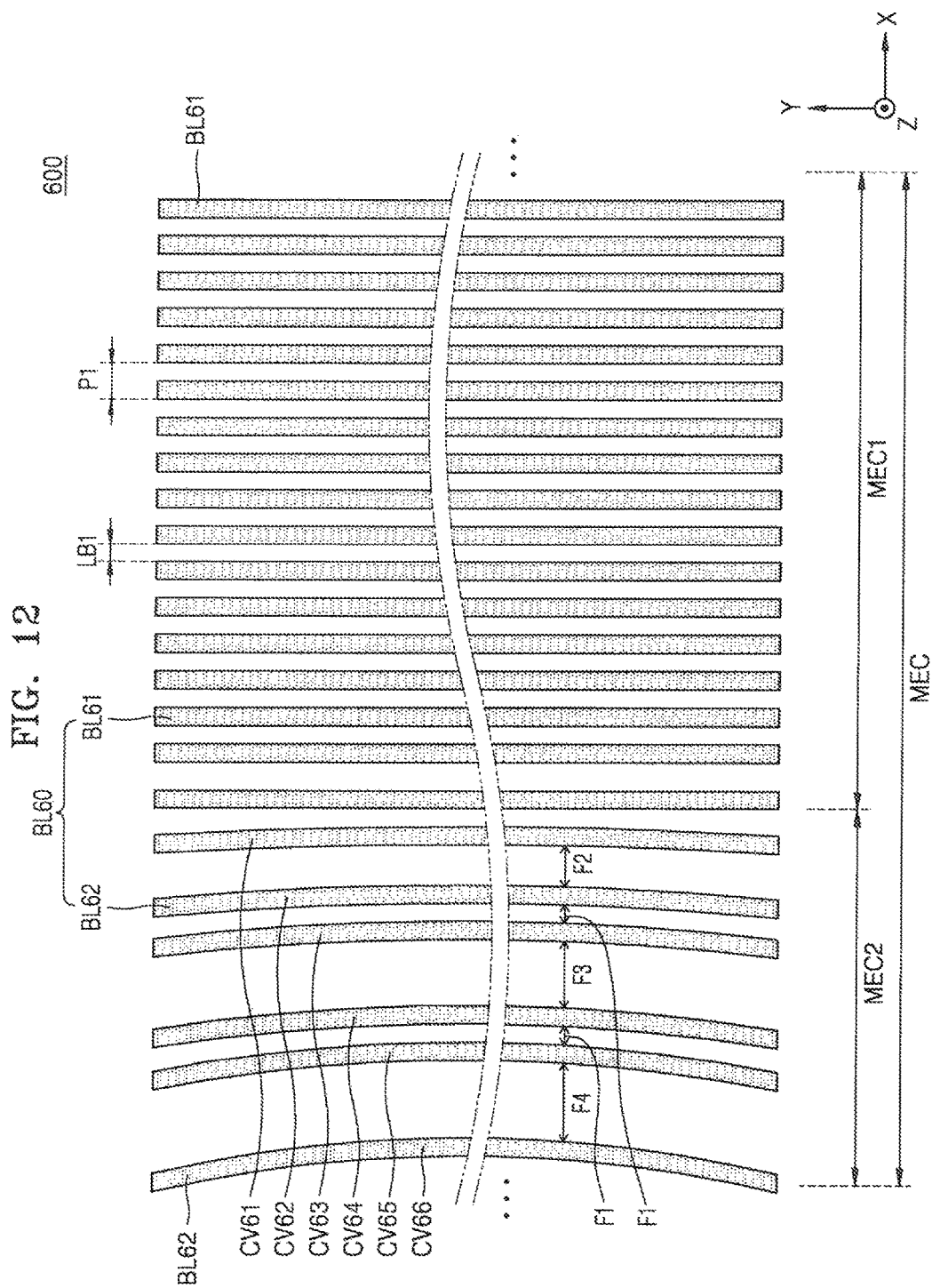

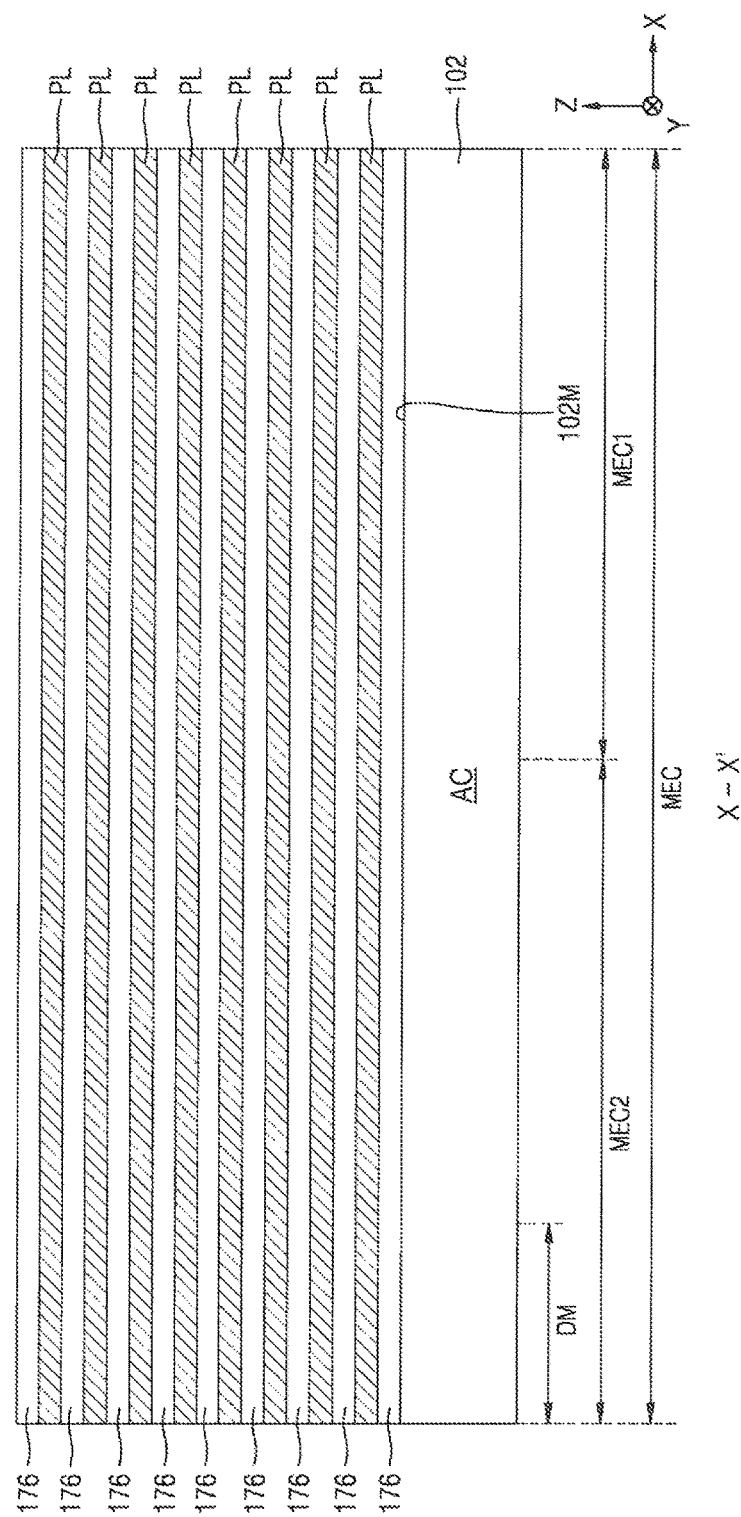

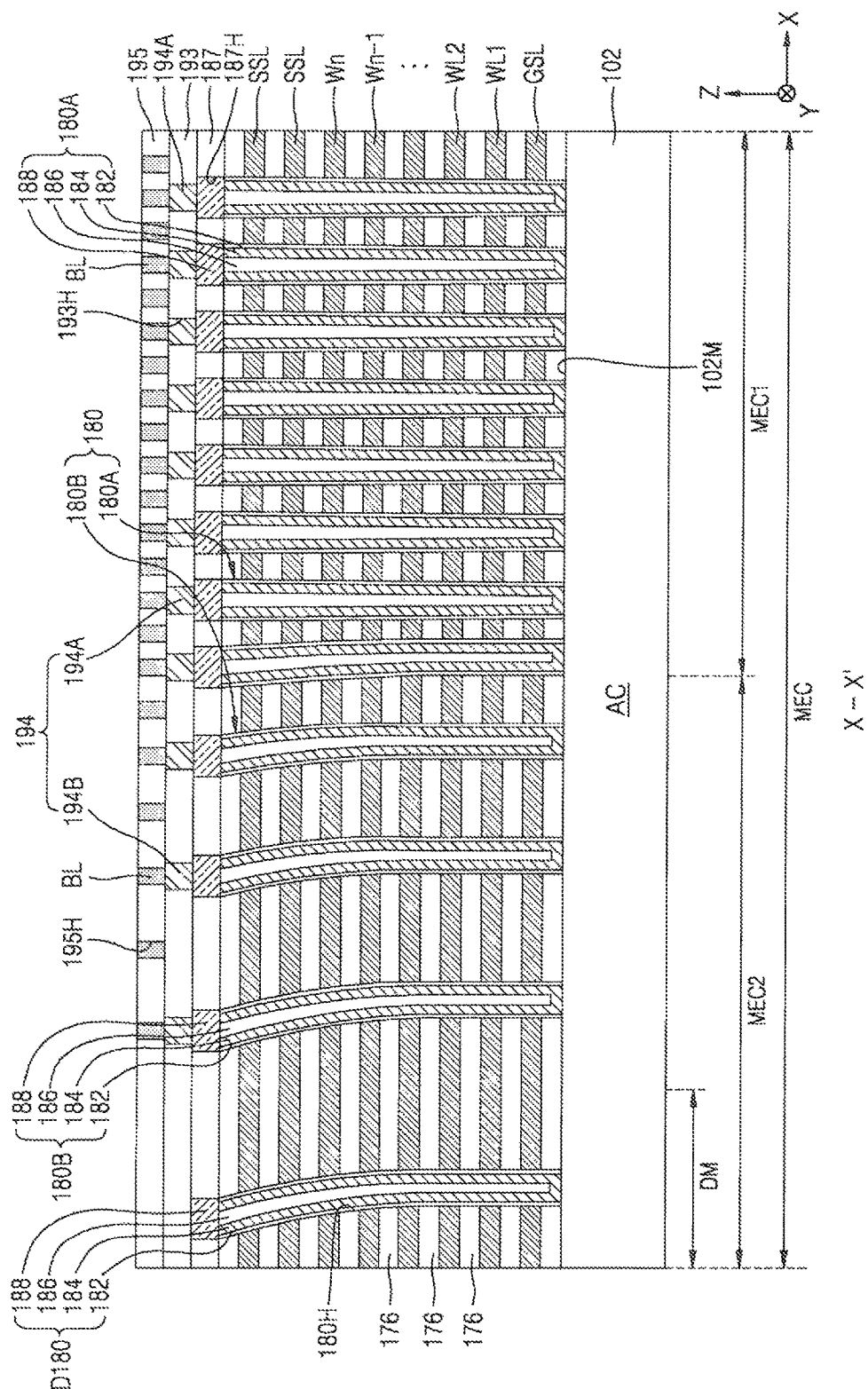

INTEGRATED CIRCUIT DEVICES INCLUDING A VERTICAL MEMORY DEVICE

CROSS-REFERENCE TO RELATED APPLICATION

This application claims the benefit of Korean Patent Application No. 10-2017-0092733, filed on Jul. 21, 2017, in the Korean Intellectual Property Office, the entire contents of which are incorporated herein by reference.

BACKGROUND

The inventive concepts relate to integrated circuit devices, and more particularly, to integrated circuit devices including a nonvolatile vertical memory device.

As information communication devices become increasingly multifunctional, a large capacity and high integration of integrated circuit devices including a memory device may be desired. With a reduction of the memory cell size for high integration, operation circuits and wiring structures included in the memory device for operation and electrical connection of the memory device are becoming complicated. Accordingly, there is a demand for integrated circuit devices including a memory device having excellent electrical characteristics while having an improved degree of integration.

SUMMARY

The inventive concepts provide integrated circuit devices including a vertical memory device having a structure capable of suppressing an undesirable increase in a chip size and improving the integration degree by minimizing the number of dummy channels in a memory cell region and maximizing the number of bit lines passing through the memory cell region even when the number of word lines stacked in the memory cell region of the vertical memory device increases.

According to an aspect of the inventive concepts, there is provided an integrated circuit device including a plurality of word lines extending in a first horizontal direction parallel to a main surface of a substrate and overlapping each other in a vertical direction, on the substrate, a plurality of channel structures extending in the vertical direction through the plurality of word lines on an area of the substrate, a plurality of bit line contact pads on the plurality of channel structures, and a plurality of bit lines connected to the plurality of channel structures through the plurality of bit line contact pads on the area, wherein the plurality of bit lines include a plurality of first bit lines extending parallel to each other at a first pitch in a center region of the area, and a plurality of second bit lines extending at a second pitch in an edge region of the area, the second pitch being different from the first pitch.

According to another aspect of the inventive concepts, there is provided an integrated circuit device including a plurality of word lines extending parallel to a main surface of a substrate and overlapping each other in a vertical direction perpendicular to the main surface, the substrate having a memory cell region and a connection region sequentially arranged in a first horizontal direction, a plurality of word line cut regions extending in the first horizontal direction and defining a width of the plurality of word lines in a second horizontal direction perpendicular to the first horizontal direction, a plurality of channel structures extending in the vertical direction through the plurality of word lines in the memory cell region, and a plurality of bit lines arranged on the plurality of channel structures in the memory cell region, wherein the plurality of channel structures include a plurality of nonlinear channel structures extending nonlinearly in the memory cell region in the vertical direction, and the plurality of bit lines include a plurality of nonlinear bit lines arranged at a variable pitch in the memory cell region in the first horizontal direction and extending on the plurality of nonlinear channel structures in the second horizontal direction.

According to another aspect of the inventive concepts, there is provided an integrated circuit device including a plurality of word lines extending parallel to a main surface of a substrate and overlapping each other in a vertical direction perpendicular to the main surface on the substrate, a common source line extending in the first horizontal direction on the substrate along one side of the plurality of word lines, a plurality of channel structures extending through the plurality of word lines in the vertical direction, a plurality of bit line contact pads on the plurality of channel structures, and a plurality of bit lines connected to the plurality of channel structures through the plurality of bit line contact pads, wherein the plurality of channel structures include a plurality of first channel structures extending linearly in the vertical direction and a plurality of second channel structures extending nonlinearly in the vertical direction, and the plurality of bit lines include a plurality of first bit lines extending linearly in a second horizontal direction perpendicular to the first horizontal direction and a plurality of second bit lines extending nonlinearly in the second horizontal direction.

BRIEF DESCRIPTION OF THE DRAWINGS

Embodiments of the inventive concepts will be more clearly understood from the following detailed description taken in conjunction with the accompanying drawings in which:

FIGS. 8 to 12 illustrate plan views showing various configurations of a plurality of bit lines included in an integrated circuit device, according to embodiments of the inventive concepts;

FIGS. 13A, 13B, 13C, 13D, and 13E illustrate cross-sectional views showing a method of manufacturing an integrated circuit device, according to embodiments of the inventive concepts.

DETAILED DESCRIPTION

Figure 1:
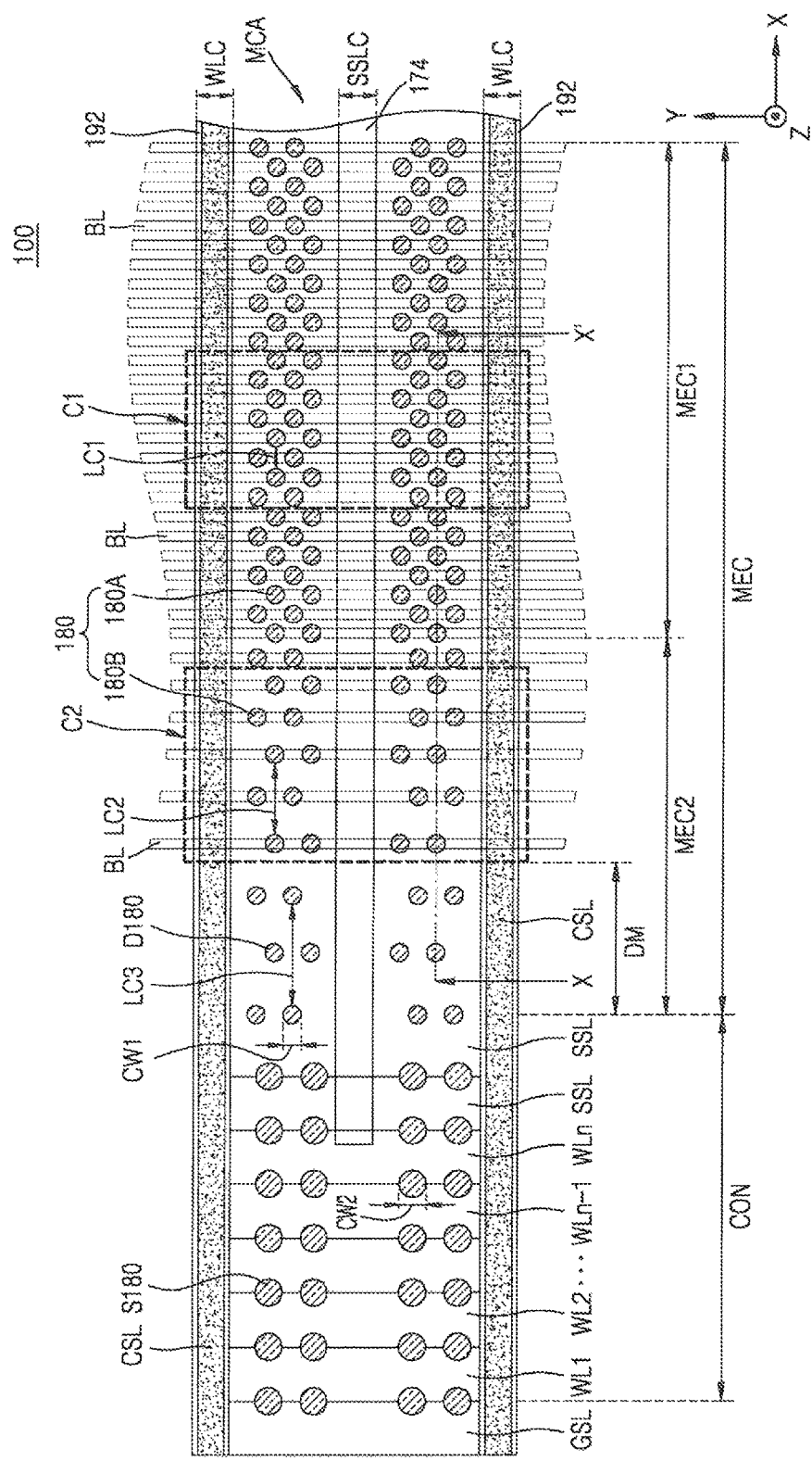
FIG. 1 illustrates a plan view showing configurations of an integrated circuit device according to an embodiments of the inventive concepts.

The same reference numerals are used for the same elements in the drawings, and the repeated descriptions thereof will be omitted.

Figure 2A:
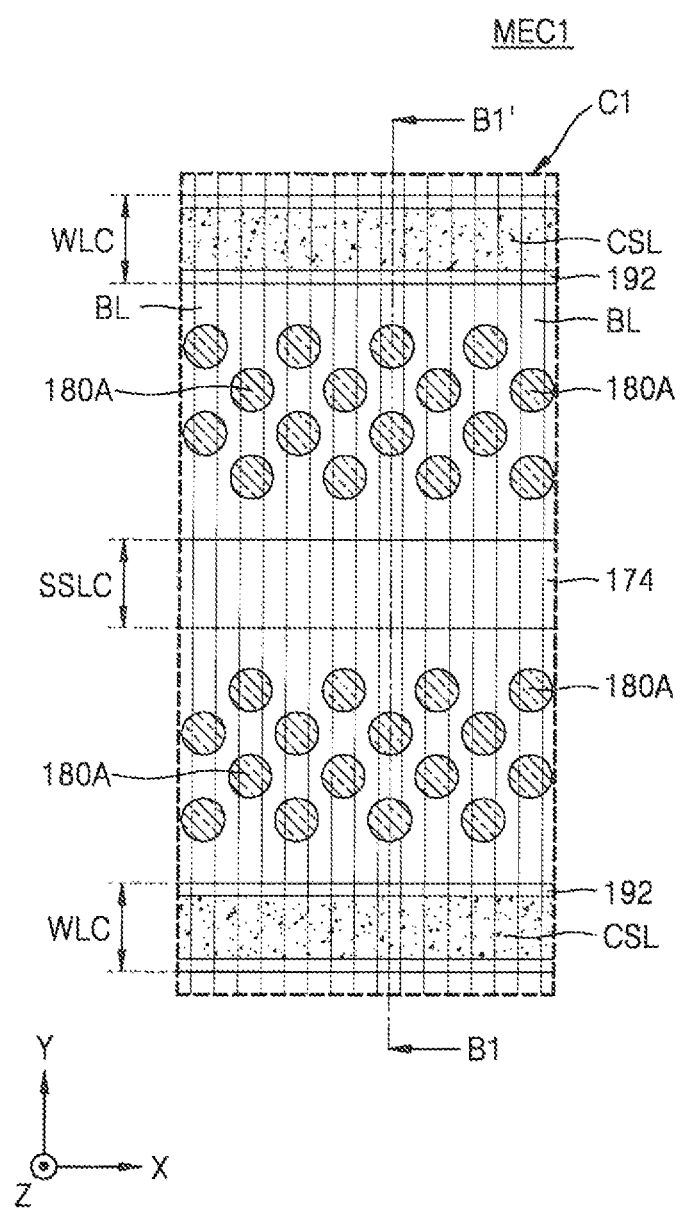
FIG. 2A illustrates an enlarged plan view showing, a region denoted as "C1" in FIG. 1.
Figure 2B:
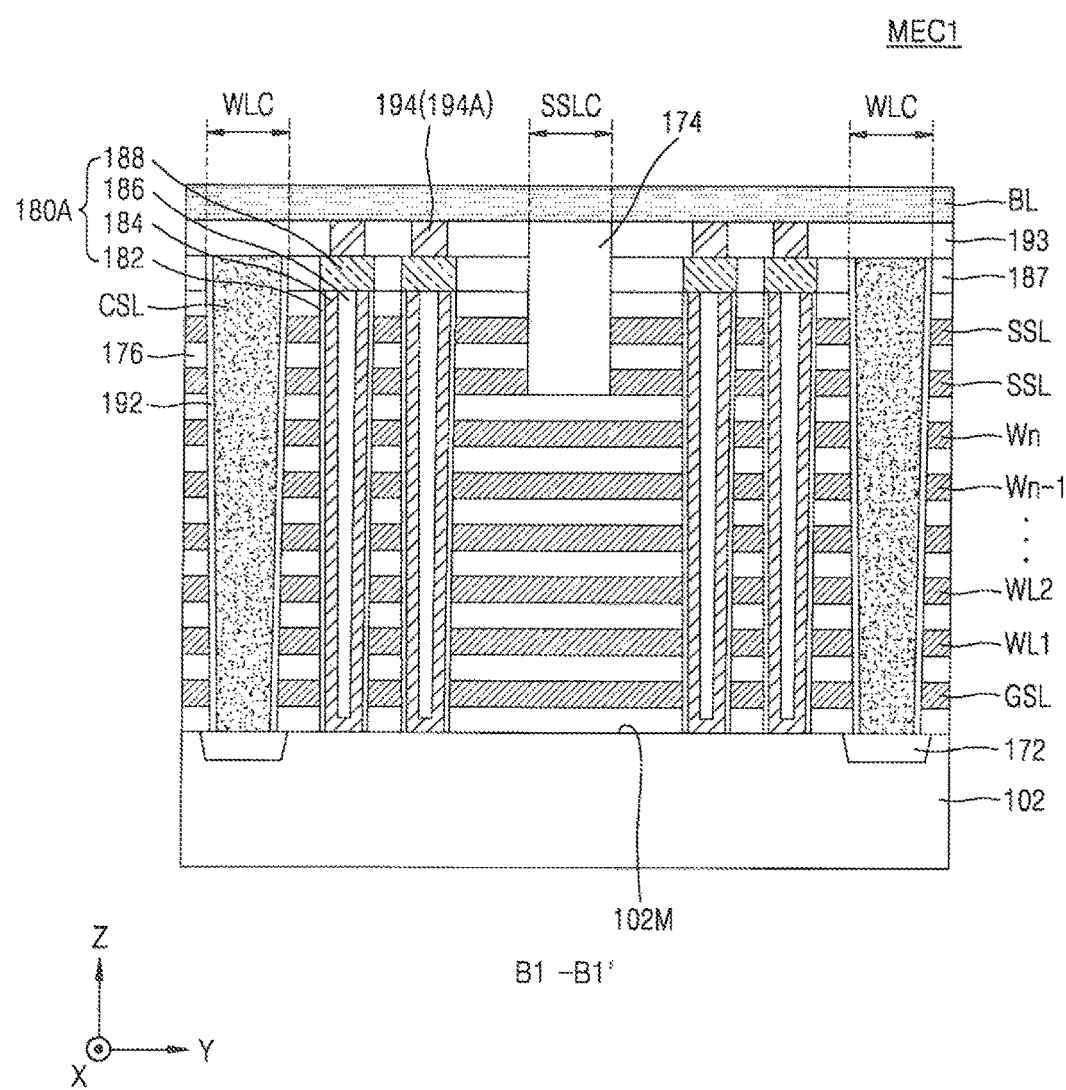
FIG. 2B illustrates a cross-sectional view taken along a line B1-B1' of FIG. 2A.
Figure 3A:
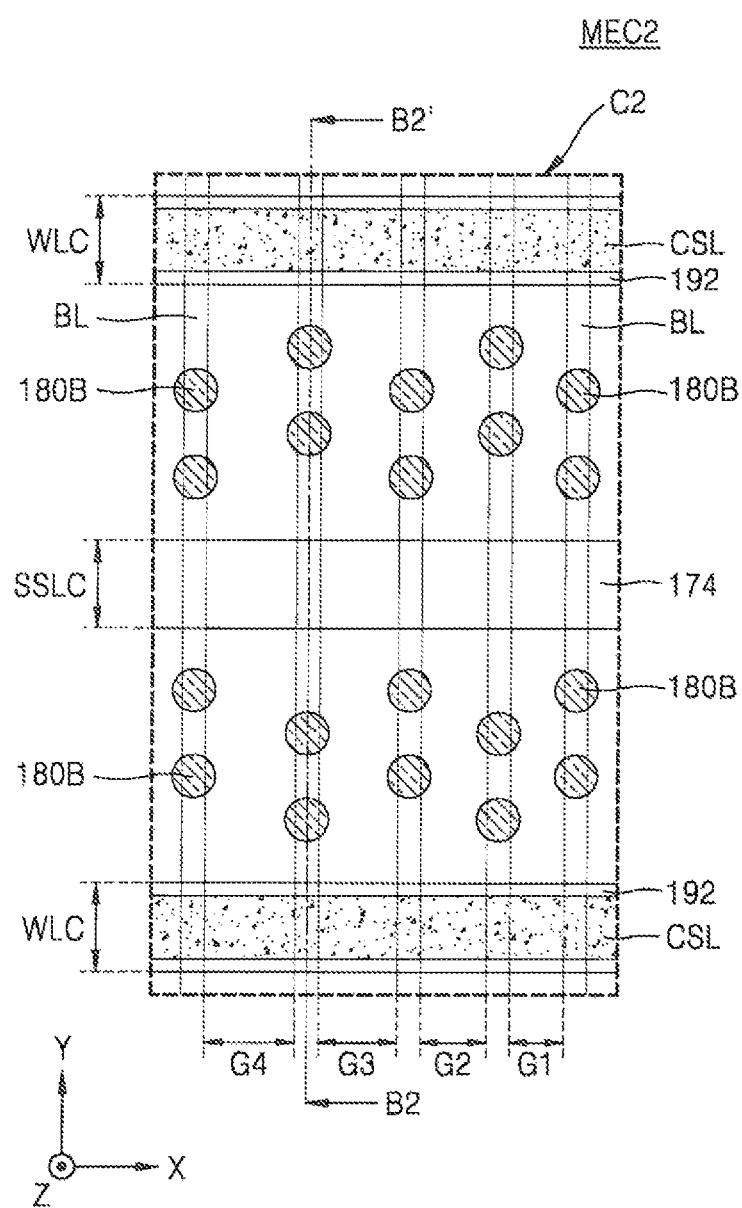
FIG. 3A illustrates an enlarged plan view showing a region denoted as "C2" in FIG. 1.
Figure 3B:
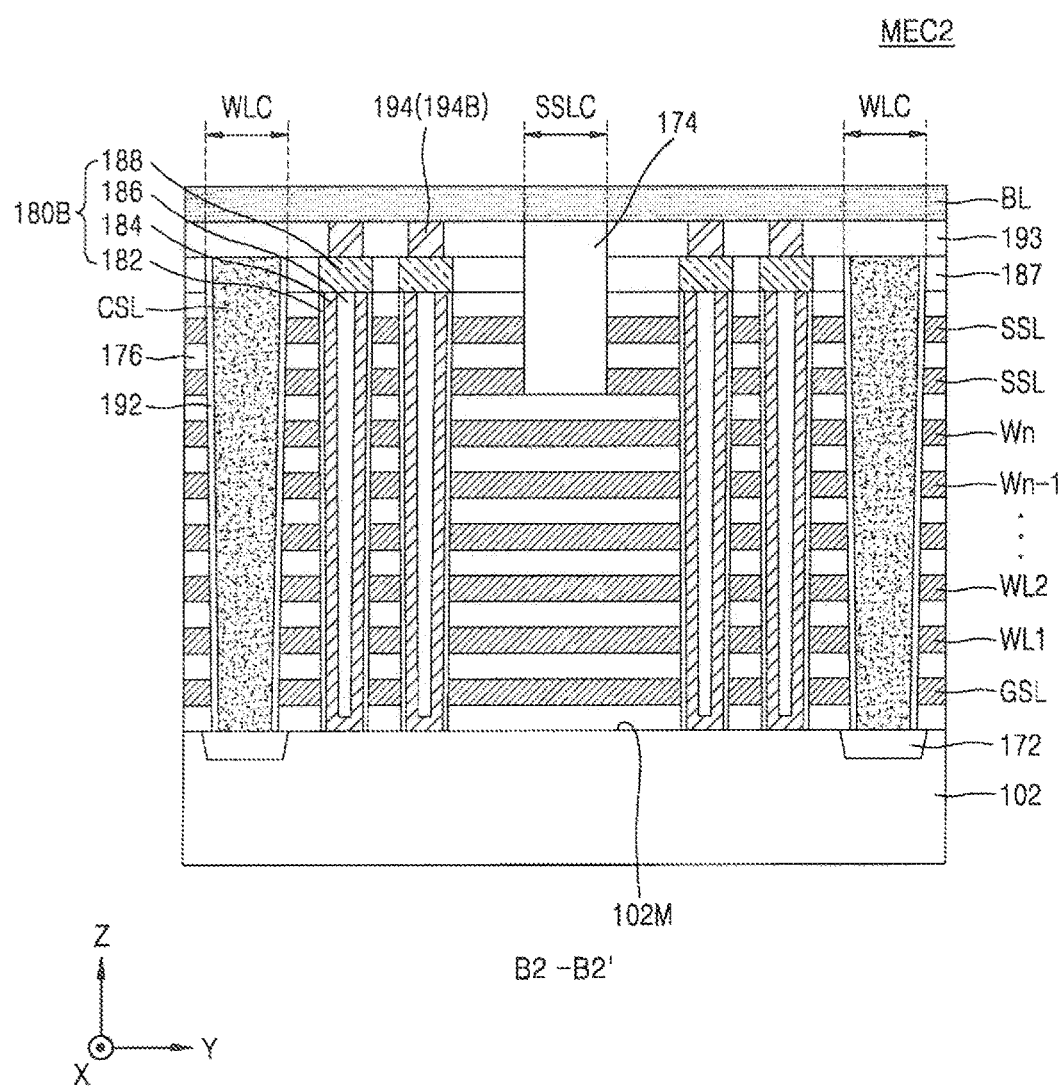
FIG. 3B illustrates a cross-sectional view taken along a line B2-B2' of FIG. 3A.
Figure 4:
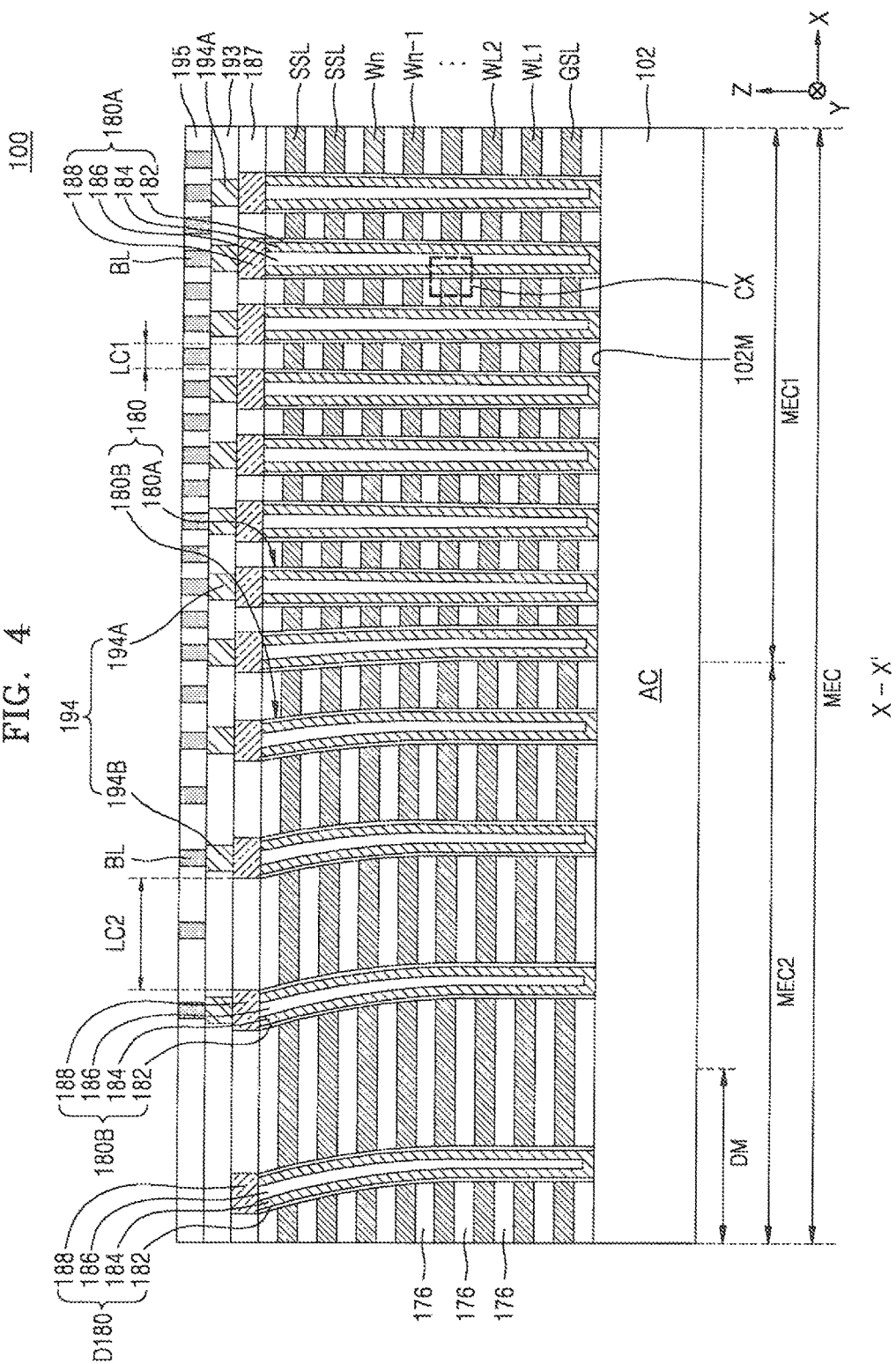
FIG. 4 illustrates an enlarged cross-sectional view taken along a line X-X' of FIG. 1.
Figure 5:
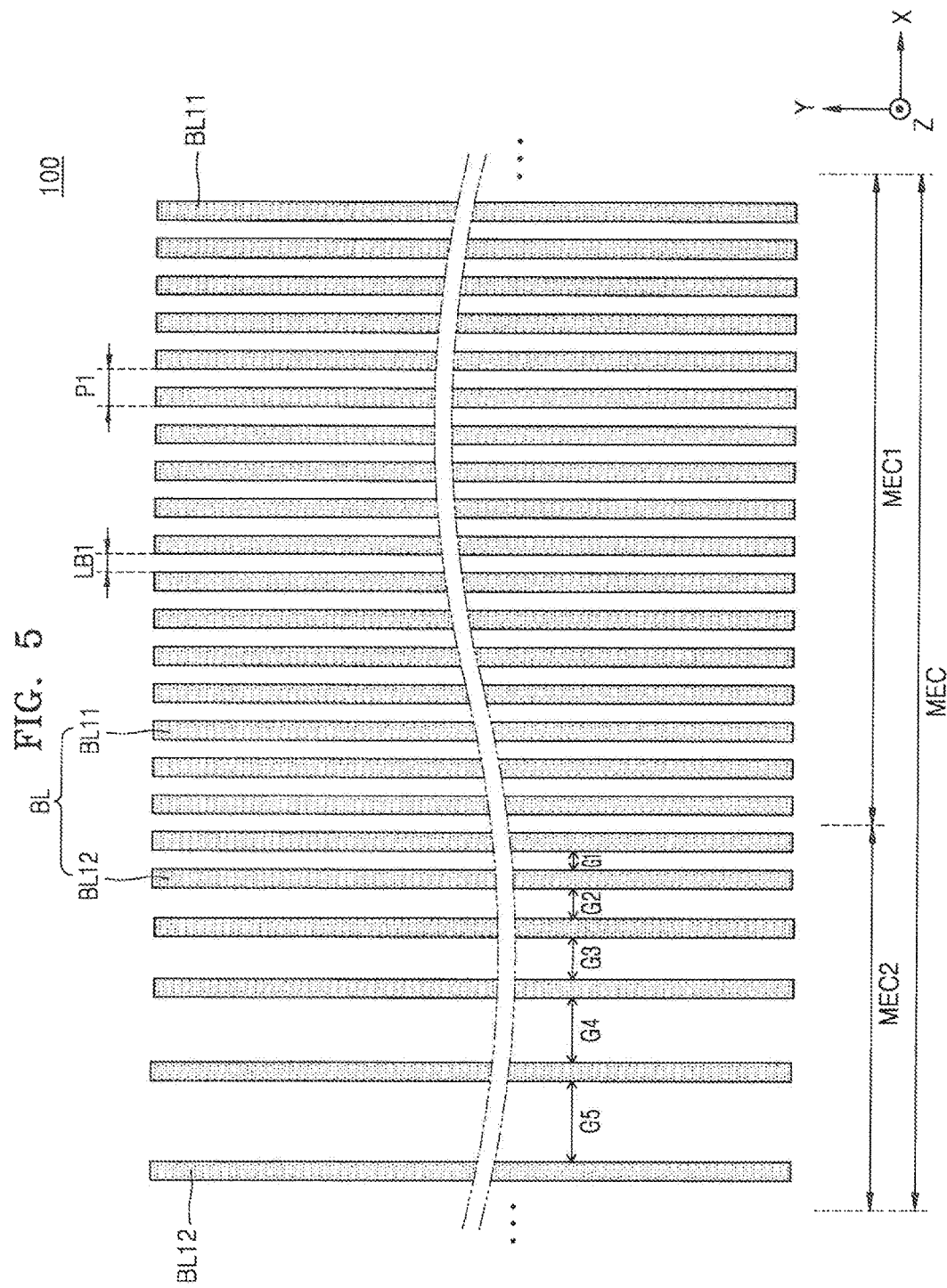
FIG. 5 illustrates a plan view showing a plurality of bit lines included in a portion of the integrated circuit device of FIG. 1.

FIGS. 1 to 5 illustrate views for explaining an integrated circuit device according to embodiments of the inventive concepts. Particularly, FIG. 1 illustrates a plan view showing configurations of an integrated circuit device 100 according to embodiments of the inventive concepts. FIG. 2A illustrates an enlarged plan view showing a region denoted as "C1" in FIG. 1, and FIG. 2B illustrates a cross-sectional view taken along a line B1-B1' of FIG. 2A. FIG. 3A illustrates an enlarged plan view showing a region denoted as "C2" in FIG. 1, and FIG. 3B illustrates a cross-sectional view taken along a line B2-B2' of FIG. 3A. FIG. 4 illustrates an enlarged cross-sectional view taken along a line X-X' of FIG. 1. FIG. 5 illustrates a plan view showing a plurality of bit lines BL included in a portion of the integrated circuit device 100 of FIG. 1.

Referring to FIGS. 1 to 5, the integrated circuit device 100 may include a memory cell region MEC and a connection region CON. In the memory cell region MEC, a memory cell array MCA may be formed on the active region AC of the substrate 102. The memory cell array MCA may have a circuit configuration as described below with reference to FIG. 1.

The memory cell region MEC includes a center region MEC1 and an, edge region MEC2. The center region MEC1 may be spaced apart from the connection region CON with the edge region MEC2 therebetween. The connection region CON may be disposed on an edge side of the memory cell region MEC. The connection region CON may be a region in which wires connected from word lines WL or selection lines of each vertical memory cell of the memory cell region MEC are arranged. Although the connection region CON is only disposed on one side of the memory cell region MEC in FIG. 1, the connection region CON may be disposed on both sides of the memory cell region MEC.

The substrate 102 of the integrated circuit device 100 may include a main surface 102M extending in an X direction and a Y direction. In some embodiments, the substrate 102 may include Si, Ge, or SiGe. In some embodiments, the substrate 102 may include a silicon-on-insulator (SOI) substrate, or a germanium-on-insulator (GeOI) substrate.

Figure 6:
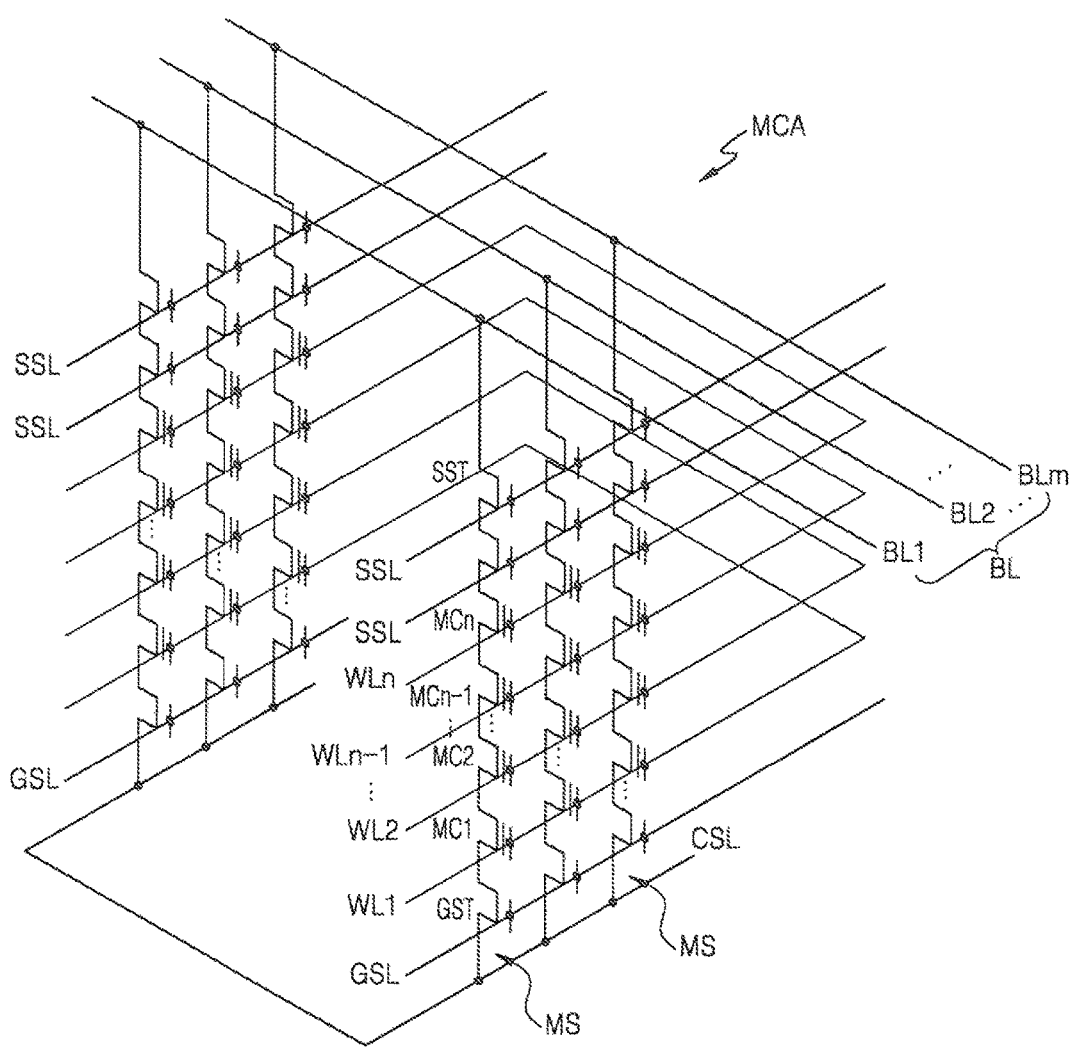
FIG. 6 illustrates an equivalent circuit diagram of the memory cell array included in the memory cell region of the integrated circuit device of FIGS. 1 to 5, according to embodiments of the inventive concepts.

FIG. 6 illustrates an equivalent circuit diagram of the memory cell array MCA included in the memory cell region MEC of the integrated circuit device 100 described with reference to FIGS. 1 to 5. FIG. 6 illustrates an example of an equivalent circuit diagram of a vertical NAND flash memory device having a vertical channel structure.

Referring to FIG. 6, the memory cell array MCA may include a plurality of memory cell strings MS. The memory cell array MCA may include a plurality of bit lines BL: BL1 BL2, . . . , BLm, a plurality of word lines WL: WL1, WL2, . . . , WLn-1, WLn, at least one string selection line SSL, at least one ground selection line GSL, and a common source line CSL. The plurality of memory cell strings MS may be formed between the plurality of bit lines BL: BL1, B2, . . . , BLm and the common source line CSL.

The plurality of memory cell strings MS may include a string selection transistor SST, a ground selection transistor GST, and a plurality of memory cell transistors MC1, MC2, . . . , MCn-1, and MCn. A drain region of the string selection transistor SST may be connected to the plurality of bit lines BL: BL1, BL2, . . . , BLm, and a source region of the ground selection transistor GST may be connected to the common source line CSL. The common source line CSL may be a region in which source regions of a plurality of ground selection transistors GST are connected in common.

The string selection transistor SST may be connected to the string selection line SSL, and the ground selection transistor CST may be connected to the ground selection line GSL. The plurality of memory cell transistors MC1, MC2, . . . , MCn-1, and MCn may be respectively connected to the plurality of word lines WL: WL1, WL2, . . . , WLn-1, WLn.

Referring to FIGS. 1 to 5, in the memory cell array MCA including a configuration described with reference to FIG. 6, the plurality of memory cell transistors MC1, MC2, . . . , MCn-1, and MCn that constitute a memory cell string MS may have a structure connected in series in a vertical direction (e.g., a Z direction) with respect to a main surface 102M of the substrate 102. Thus, a plurality of channel structures 180 constituting the string selection transistor SST, the ground selection transistor OST, and the plurality of memory cell transistors MC1, MC2, . . . , MCn-1, and MCn may be formed to extend in a vertical direction with respect to the main surface 102M of the substrate 102.

In the memory cell region MEC, the plurality of word lines WL: WL1, WL2, . . . , WLn-1, WLn may extend on the substrate 102 in a horizontal direction parallel to the main surface 102M (e.g., along an X-Y plane), and may be spaced apart from each other to overlap each other in a vertical direction (e.g., a Z direction) perpendicular to the main surface 102M of the substrate 102.

A plurality of word line cut regions WLC may extend in a first horizontal direction (e.g., an X direction) parallel to the main surface 102M of the substrate 102. The plurality of word line cut regions WLC may define a width of file plurality of word lines WL: WL1, WL2, . . . , WLn-1, WLn disposed in a second horizontal direction (e.g., a Y direction) perpendicular to the first horizontal direction. The plurality of word lines WL: WL1, WL2, . . . , WLn-1, WLn may be repeatedly disposed at regular intervals to be spaced apart from each other by the plurality of word line cut regions WLC.

On the substrate 102, a plurality of common source regions 172 may extend in the first horizontal direction (e.g. the X direction). In some embodiments, the plurality of common source regions 172 may be impurity regions highly doped with n-type impurities. The plurality of common source regions 172 may serve as source regions for supplying current to vertical memory cells. A plurality of common source lines CSL may extend on the plurality of common source regions 172 in the first horizontal direction (e.g., the X direction). The plurality of common source lines CSL may be formed to fill a portion of a word line cut region WLC on one side of a pair of ground selection lines GSL, the plurality of word lines WL: WL1, WL2, . . . , WLn-1, WLn, and a pair of string selection lines SSL.

At least one ground selection line GSL, the plurality of word lines WL: WL1, WL2, . . . , WLn-1, WLn, and at least one string selection line SSL may be sequentially stacked between two neighboring word line cut regions WLC. Although, it is illustrated in FIGS. 1 to 4 that one ground selection line GSL, five word lines WL, and two string selection lines SSL are sequentially stacked on the substrate 102 in the vertical direction, this is for convenience of description and illustration and the inventive concepts are not limited thereto. Two neighboring string selection lines SSL in the second horizontal direction (e.g., the Y direction) are spaced apart from each other with a string selection line cut region SSLC therebetween. The string selection line cut region SSLC may be filled with an insulating film 174. The insulating film 174 may include, for example, an oxide film, a nitride film, or a combination thereof. At least a portion of the string selection line cut region SSLC may be filled with an air gap.

Each of at least one ground selection line GSL, the plurality of word lines WL: WL1, WL2, . . . , WLn-1, WLn, and at least one string selection line SSL may include a metal, metal silicide, a semiconductor doped with impurities, or a combination thereof. For example, each of at least one ground selection line GSL, the plurality of word lines WL: WL1, WL2, . . . , WLn-1, WLn, and at least one string selection line SSL may include, for example, a metal such as tungsten, nickel, cobalt and tantalum, metal silicide such as tungsten suicide, nickel silicide, cobalt silicide. and tantalum silicide, polysilicon doped with impurities, or a combination thereof An insulating film 176 may be interposed between the substrate 102 and at least one ground selection line GSL, between at least one ground selection line GSL and a word fine WL, between word lines WL, and between a word line WL and at least one string selection line SSL. The insulating film 176 may include, for example, silicon oxide, silicon nitride, and/or silicon oxynitride.

The plurality of channel structures 180 may extend in the memory cell region MEC in the vertical direction (e.g., the Z direction) through at least on ground selection line (GSL, the plurality of word lines WL: WL1, WL2, . . . , WLn-1, WLn, at least one string selection line SSL, and a plurality of insulating films 176. The plurality of channel structures 180 may be arranged to be spaced apart from each other at a predetermined interval in the X direction and the Y direction.

The plurality of channel structures 180 may include a plurality of first channel structures 180A linearly extending in the vertical direction (e.g., the Z direction) in the center region MEC1 of the memory cell region MEC, and a plurality of second channel structures 180B nonlinearly extending in the vertical direction (e.g., the Z direction) in the edge region MEC2 of the memory cell region MEC.

The plurality of first channel structures 180A and the plurality of second channel structures 180B may have substantially the same configuration. In other words, each of the plurality of first channel structures 180A and the plurality of second channel structures 180B may include a gate dielectric film 182, a channel region 184, a buried insulating film 186, and a drain region 188. In some embodiments, a barrier metal film (not shown) may be formed between the gate dielectric film 182 and a ground selection line GSL, between the gate dielectric film 182 and the plurality of word lines WL1, WL2, . . . , WLn-1, WLn, and between the gate dielectric film 182 and the string selection line SSL.

The channel region 184 may include doped polysilicon and/or undoped polysilicon. The channel region 184 may have a cylindrical shape. An inner space of the channel region 184 may be filled with the buried insulating film 186.

The buried insulating film 186 may include an insulating material. For example, the buried insulating film 186 may include, for example, silicon oxide, silicon nitride, silicon oxynitride or a combination thereof. In some embodiments, the buried insulating film 186 may be omitted, and in this case, the channel region 184 may have a pillar structure without an inner space.

The drain region 188 included in each of the plurality of first channel structures 180A and the plurality of second channel structures 180B may include a polysilicon film doped with impurities. A plurality of drain regions 188 may be insulated from each other by an insulating film 187. The insulating film 187 may include, for example, an oxide film, a nitride film, or a combination thereof.

As illustrated in FIGS. 2A, 2B and 4, the plurality of first channel structures 180A may have a shape linearly extending in the vertical direction (e.g., the Z direction) from an extension direction (e.g., X direction) of a word line cut region WLC and an extension direction (e.g., Y direction) of a bit line BL and may be disposed at regular intervals in the X direction and the Y direction. As used herein with respect to the first channel structures 180A and the second channel structures 180B, the phrase "linearly extending" means that, for example, the first channel structures 180A extend in a substantially straight line. It will be understood by those of skill in the art that an exactly straight line is not required by the inventive concepts, as minor deviations are expected as a result of manufacturing variations. In some embodiments, an extending line of a first channel structure 180A may not deviate by more than ten degrees from a substantially straight line. In some embodiments, an extending line of a first channel structure 180A in a vertical direction (e.g., the Z direction) may not deviate in a particular direction by more than ten degrees from a line normal to the main surface 102M of the substrate 102. In some embodiments, sidewalls of the first channel structure 180A may extend along a substantially planar surface in the vertical direction.

The plurality of second channel structures 180B may be nonlinear in shape in at least one horizontal direction. For example, as illustrated in FIG. 4, the plurality of second channel structures 180B may extend nonlinearly in the vertical direction (e.g., the Z direction) from an extension direction (e.g., the X direction) of a word line cut region WLC. In some embodiments, to "extend nonlinearly" means that an extending line of a second channel structure 180B deviates in a particular direction from a substantially straight line. In some embodiments, an extending line or a second channel structure 180B may deviate in a particular direction by more than ten degrees from a substantially straight line. In some embodiments, at least a portion of the second channel structure 180B may tilt and/or lean in a particular direction as compared to a substantially straight line. In some embodiments, an extending line of a second channel structure 180B in a vertical direction (e.g., the Z direction) may deviate in a particular direction by more than ten degrees from a line normal to the main surface 102M of the substrate 102. In some embodiments, sidewalls of the second channel structure 180B may extend along a non-planar surface in the vertical direction.

As illustrated in FIG. 3B, the plurality of second channel structures 180B may extend linearly in the vertical direction (e.g., the Z direction) from an extension direction of a bit line BL (e.g., the Y direction). In other words, the plurality of second channel structures 180B may be tilted in one direction (e.g., the X direction) but may not be tilted in a second direction (e.g., the Y direction.) In some embodiments, unlike the example shown in FIG. 3B, the plurality of second channel structures 180B may also extend nonlinearly in the vertical direction (e.g., the Z direction) from an extension direction (e.g., the Y direction) of a bit line BL. In other words, in some embodiments, the plurality of second channel structures 180B may extend nonlinearly and/or tilt in more than one direction.

A nonlinear extension of the plurality of second channel structures 180B in the vertical direction (e.g., the Z direction) may be caused by the difference between the physical effect of the center region MEC1 on the plurality of channel structures 180 and the physical effect of the edge region MEC2 on the plurality of channel structures 180 in the memory cell region MEC of the integrated circuit device 100. Due to the type and size of stress and the thermal budget generated during the manufacturing process of the integrated circuit device 100, the plurality of first channel structures 180A disposed in the center region MEC1 of the memory cell region MEC may extend linearly in the vertical direction (e.g., the Z direction), but the plurality of second channel structures 180B disposed in the edge region MEC2 of the memory cell region MEC may extend nonlinearly in the vertical direction (e.g., the Z direction).

The edge region MEC2 of the memory cell region MEC may include a dummy channel region DM disposed at a portion adjacent to the connection region CON. A plurality of dummy channel structures D180 may be disposed in the dummy channel region DM of the edge region MEC2. The plurality of dummy channel structures D180 may have substantially the same configuration as the plurality of first channel structures 180A and the plurality of second channel structures 180B. In other words, each of the plurality of dummy channel structures D180 may include the gate dielectric film 182, the channel region 184, the buried insulating film 186, and the drain region 188. As illustrated in FIG. 4, the plurality of dummy channel structures D180 may extend nonlinearly in the vertical direction (e.g., the Z direction), which is similar to the plurality of second channel structures 180B.

The plurality of second channel structures 180B and the plurality of dummy channel structures D180 that are nonlinear channel structures disposed in the edge region MEC2 of the memory cell region MEC may have substantially the same configuration. However, the plurality of second channel structures 180B may each be a normal channel structure capable of being connected to any one bit line BL from among a plurality of bit lines BL to constitute a memory cell string MS. On the other hand, the plurality of dummy channel structures D180 may not be connected to any of a plurality of bit lines and thus, may be a dummy channel structure D180 that does not contribute to a configuration of a memory cell string MS and does not contribute to an operation of an actual device.

In the extension direction (e.g., the X direction) of a word line cut region a first separation distance LC1 between upper surfaces of two neighboring first channel structures 180A from among the plurality of first channel structures 180A disposed in the center region MEC1 may be less than a second separation distance LC2 between upper surfaces of two neighboring second channel structures 180B from among the plurality of second channel structures 180B disposed in the edge region MEC2. A third separation distance LC3 in the extension direction (e.g., the X direction) of a word line cut region WLC between upper surfaces of two neighboring dummy channel structures D180 from among the plurality of dummy channel structures D180 may be equal to or greater than the second separation distance LC2. In some embodiments, in the center region MEC1, the first separation distance LC1 in the extension direction (e.g., the X direction) of a word line cut region WLC may be substantially the same regardless of the position. In some embodiments, in the edge region MEC2, the second separation distance LC2 and the third separation distance LC3 may increase as they get farther from the center region MEC1.

Although it is illustrated in FIGS. 2A to 4 that the plurality of channel structures 180 and the plurality of dummy channel structures D180 include the gate dielectric film 182 and the gate dielectric film 182 extends along the channel region 184 in the vertical direction (e.g., the Z direction), the inventive concepts are not limited thereto.

Figure 7A:
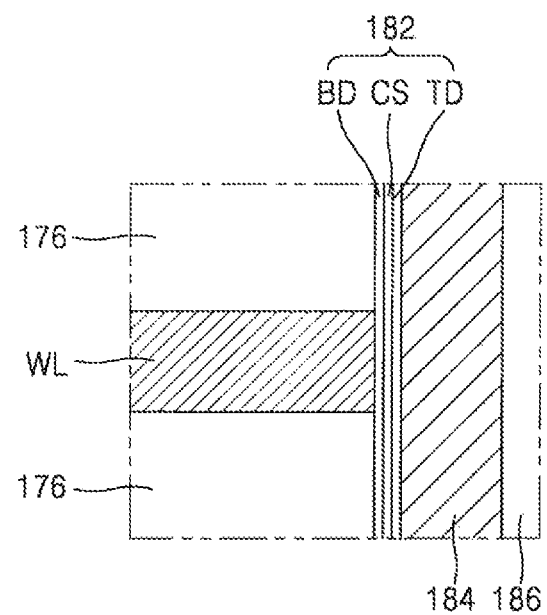
FIGS. 7A, 7B, 7C and 7D respectively illustrate cross-sectional views showing various configurations of gate dielectric films included in an integrated circuit device, according to embodiments of the inventive concepts.

FIG. 7A illustrates a cross-sectional view of the gate dielectric film 182 in FIGS. 2A to 4, showing an enlarged view of a region denoted by "CX" in FIG. 4.

Referring to FIG. 7A, the gate dielectric film 182 may have a structure including a tunneling dielectric film TD, a charge storage film CS, and a blocking dielectric film BD sequentially formed adjacent the channel region 184. A relative thickness of the tunneling dielectric film TD, the charge storage film CS, and the blocking dielectric film BD constituting the gate dielectric film 182 is not limited to an example shown in FIG. 7A and may be variously modified.

The tunneling dielectric film TD may include, for example, silicon oxide, hafnium oxide, aluminum oxide, zirconium oxide, tantalum oxide, and/or the like. The charge storage film CS is a region where electrons passing through tunneling dielectric film TD from the channel region 184 may be stored, and may include, for example, silicon nitride, boron nitride, silicon boron nitride, and/or polysilicon doped with impurities. The blocking dielectric film BD may include, for example, metal oxide having a higher dielectric constant than silicon oxide, silicon nitride, and/or silicon oxide. The metal oxide may include, for example, hafnium oxide, aluminum oxide, zirconium oxide, tantalum oxide, or a combination thereof.

Figure 7B:
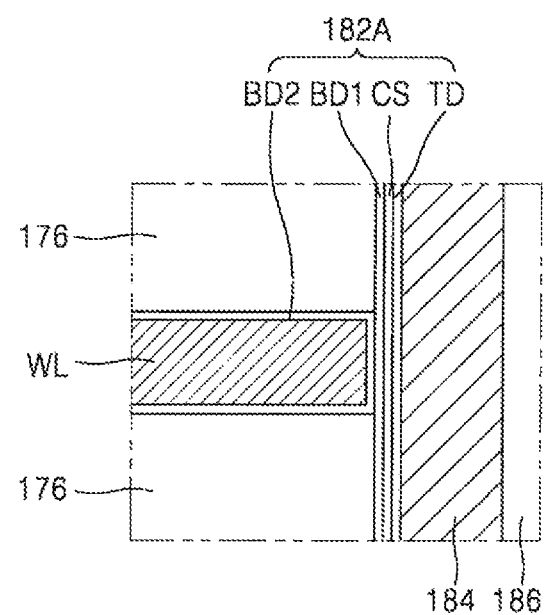
Figure 7C:
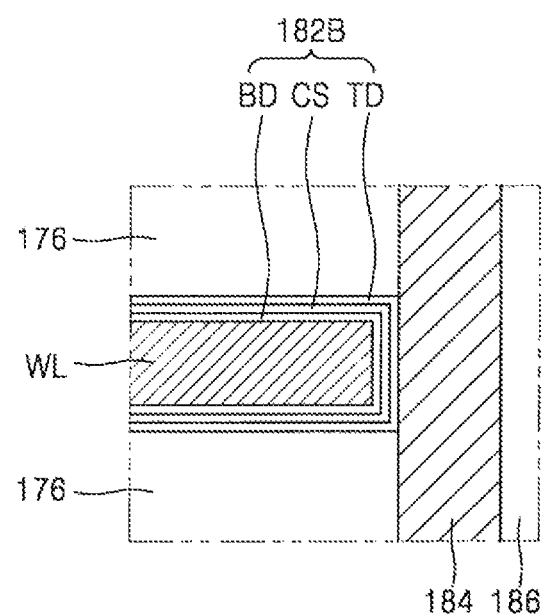
Figure 7D:
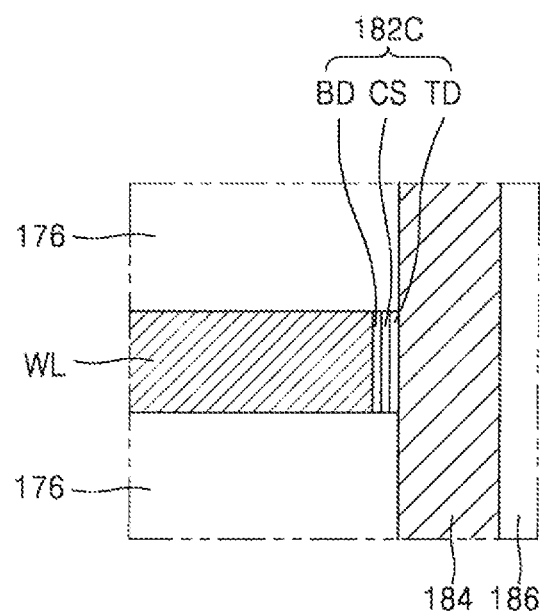

FIGS. 7B to 7D respectively illustrate cross-sectional views showing structures of gate dielectric films 182A, 182B, and 182C that may be included instead of the gate dielectric film 182 of FIG. 7A.

In some embodiments, the integrated circuit device 100 may include the gate dielectric film 182A of FIG. 7B instead of the gate dielectric film 182. The gate dielectric film 182A may have substantially the same configuration as the gate dielectric film 182 of FIG. 7A. However, the gate dielectric film 182A includes a first blocking dielectric film BD1 and a second blocking dielectric film BD2 instead of the blocking dielectric film BD. The first blocking dielectric film BD1 may extend alongside the channel region 184 with the tunneling dielectric film TD and the charge storage film CS, and the second blocking dielectric film BD2 may be disposed to surround a word line WL. Each of the first blocking dielectric film BD1 and the second blocking dielectric film BD2 may include, for example, silicon oxide, silicon nitride, and/or metal oxide. For example, the first blocking dielectric film BD1 may include a silicon oxide film, and the second blocking dielectric film BD2 may include a metal oxide film having a higher dielectric constant than a silicon oxide film.

In some embodiments, the integrated circuit device 100 may include the gate dielectric film 182B of FIG. 7C instead of the gate dielectric film 182. The gate dielectric film 182B may be formed to have a surface facing the channel region 184 and a surface facing the insulating film 176 and to cover a lower surface, an upper surface, and a sidewall of a word line WL. The gate dielectric film 182B may include a tunneling dielectric film TD, a charge storage film CS, and a blocking dielectric film BD sequentially disposed adjacent the channel region 184.

In some embodiments, the integrated circuit device 100 may include the gate dielectric film 182C of FIG. 7D instead of the gate dielectric film 182. The gate dielectric film 182C is interposed between a word line WL and the channel region 184 so that the gate dielectric film 182C does not cover a lower surface and an upper surface of the word line WL and only covers a sidewall of the word line WL. The gate dielectric film 182C may include a tunneling dielectric film TD, a charge storage film CS, and a blocking dielectric film BD sequentially disposed adjacent the channel region 184.

A configuration and a shape of a gate dielectric film included in an integrated circuit device according to embodiments of the inventive concepts are not limited to those of the gate dielectric films 182, 182A, 182B, and 182C described with reference to FIGS. 7A to 7D and may be modified and changed therefrom within the scope of the inventive concepts. In some embodiments, the gate dielectric films 182, 182A, 182B, and 182C may include a material that may change the electrical resistance by heat generated from the current passing through electrodes adjacent to the gate dielectric films 182, 182A, 182B, and 182C, for example, a phase change material. The phase change material may include, for example, at least one of antimony (Sb), tellurium (Te), and selenium (Se). The phase change material may further include, for example, at least one impurity selected from N, O, C, Bi, In, B, Sn, Si, Ti, Al, Ni, Fe, Dy and La. For example, the gate dielectric films 182, 182A, 182B, and/or 182C may include GeBiTe, InSb, GeSb, and/or GaSb. In some embodiments, the gate dielectric films 182, 182A, 182B, and 182C may have a thin film structure in which the electrical resistance may be changed using a spin-transfer process according to the current. For example, the gate dielectric films 182, 182A, 182B, and/or 182C may include a ferromagnetic material or an antiferromagnetic material. In some embodiments, the gate dielectric films 182, 182A, 182B, and/or 182C may include perovskite compounds or transition metal oxide. For example, the gate dielectric films 182, 182A, 182B, and/or 182C may include niobium oxide, titanium oxide, nickel oxide, zirconium oxide, vanadium oxide, $(Pr,Ca)MnO_3$ (PCMO), strontium-titanium oxide, barium-strontium-titanium oxide, strontium-zirconium oxide, barium-zirconium oxide, and/or barium-strontium-zirconium oxide.

Referring to FIGS. 1 to 4 again, in the connection region CON, at least one ground selection line GSL, the plurality of word lines WL: WL1, WL2, ..., WLn-1, WLn, and at least one string selection line SSL sequentially stacked on the substrate 102 may have a gradually decreasing width as they move away from the substrate 102.

In the connection region CON, a plurality of dummy channel structures S180 may extend in the vertical direction (e.g., the Z direction) through at least one line of at least one ground selection line GSL, the plurality of word lines WL: WL1, WL2, ..., WLn-1, WLn, and at least one string selection line SSL. In the horizontal direction (e.g., the X direction and/or the Y direction), each width of the plurality of channel structures 180 and the plurality of dummy channel structures D180 in the memory cell region MEC may be less than each width of the plurality of dummy channel structures D180 in the connection region CON. For example, as illustrated in FIG. 1, in the Y direction, each width CW1 of the plurality of channel structures 180 and the plurality of dummy channel structures D180 in the memory cell region MEC may be less than each width CW2 of the plurality of dummy channel structures S180 in the connection region CON, which may be also applied to the X direction.

However, the inventive concepts are not limited thereto. For example, in the horizontal direction (e.g., the X direction and/or the Y direction), each width of the plurality of dummy channel structures S180 in the connection region CON may be equal to or less than each width of the plurality of channel structures 180 and the plurality of dummy channel structures D180 in the memory cell region MEC.

In the connection region CON, the plurality of dummy channel structures S180 may be disposed to be adjacent to at least one end of at least one ground selection line GSL, the plurality of word lines WL: WL1, WL2, ..., WLn-1, WLn, and at least one string selection line SSL. As the number of the plurality of word lines WL: WL1, WL2, ..., WLn-1, WLn increases, a portion in the connection region CON, which is spaced away from the memory cell region MEC, of the plurality of word lines WL: WL1, WL2, ..., WLn-1, WLn may not be supported by a channel structure 180 or a dummy channel structure D180 and thus, may have a undesired structural deformation such as warping or breakage. However, in the integrated circuit, device 100 the plurality of dummy channel structures S180 may be disposed in the connection region CON where edge portions of at least one ground selection line GSL, the plurality of word lines WL: WL1, WL2, ..., WLn-1, WLn, and at least one string selection line SSL may be disposed to support the edge portions thereof. Thus, an undesired structural deformation occurring in edge portions of at least one ground selection line GSL, the plurality of word lines WL: WL1, WL2, ..., WLn-1, WLn, and at least one string selection line SSL may be reduced and/or prevented by the plurality of dummy channel structures S180.

The plurality of dummy channel structures S180 in the connection region CON may have substantially the same configuration as the channel structure 180 and the dummy channel structure D180 in the memory cell region MEC. In other words, each of the plurality of dummy channel structures S180 may include the gate dielectric film 182, the channel region 184, the buried insulating film 186, and the drain region 188. In some embodiments, the plurality of dummy channel structures S180 in the connection region CON may linearly extend in the vertical direction (e.g., the Z direction), which is similar to the plurality of first channel structures 180A in the center region MEC1 of the memory cell region MEC. In some embodiments, the plurality of dummy channel structures S180 in the connection region CON may nonlinearly extend in vertical direction (e.g., the Z direction), which is similar to the plurality of second channel structures 180B and the plurality of dummy channel structures D180 in the edge region MEC2 of the memory cell region MEC. The plurality of dummy channel structures S180 are not connected to any one of the plurality of bit lines BL.

In the memory cell region MEC, a plurality of bit line contact pads 194 are interposed between, the plurality of channel structures 180 and the plurality of bit lines BI The drain region 188 of each of the plurality of first channel structures 180A and the plurality of second channel structures 180B may be connected to a corresponding bit line BL of the plurality of bit lines BL through a hit line contact pad 194. The plurality of bit line contact pads 194 may be mutually insulated by an insulating film 193. The plurality of bit lines BL may be mutually insulated by an insulating film 195. Each of the insulating film 193 and the insulating film 195 may include, for example, an oxide film, a nitride film, or a combination thereof.

FIG. 5 illustrates a plan view of an exemplary structure of some bit lines BL of the plurality of bit lines BL included in the integrated circuit device 100, according to embodiments of the inventive concepts.

The plurality of bit lines BL may include a plurality of linear lines extending in the second horizontal direction (e.g., the Y direction). The plurality of bit lines BL may include a plurality of first bit lines BL11 arranged at a first pitch P1 to be parallel to each other in the first horizontal direction (e.g., the X direction) in the center region MEC1 of the memory cell region MEC, and a plurality of second bit lines BL12 arranged at a variable pitch in the first horizontal direction (e.g., the X direction) and extending in the second horizontal direction (e.g., the Y direction), in the edge region MEC2 of the memory cell region MEC. The plurality of first bit lines BL11 and the plurality of second bit lines BL12 may linearly extend in a respective length direction (e.g., the Y direction). As will be understood by those of skill in the art, the first pitch P1 between the plurality of first bit lines BL11 may be substantially constant, but may vary slightly due to manufacturing variations.

In the edge region MEC2, separation distances G1, G2, G3, G4, and G5 between the plurality of second bit lines BL12 may become larger as distance from the center region MEC1 increases. In the first horizontal direction (e.g., the X direction), the separation distance LB1 between two neighboring first bit lines BL11 of the plurality of first bit lines BL11 may be less than the separation distances G1, G2, G3, G4, and G5 between two neighboring second bit lines BL12 of the plurality of second bit lines BL12.

The plurality of first channel structures 180A in the center region MEC1 of the memory cell region MEC may be each connected to any one of the plurality of first bit lines BL11 described with reference to FIG. 5, and the plurality of second channel structures 180B in the edge region MEC2 of the memory cell region MEC may be each connected to any one of the plurality of second bit lines BL12 described with reference to FIG. 5.

Referring to FIGS. 2A to 4, the plurality of bit line contact pads 194 may include a plurality of first bit line contact pads 194A disposed in the center region MEC1 of the memory cell region MEC, and a plurality of second bit line contact pads 194B disposed in the edge region MEC2 of the memory cell region MEC. The plurality of first bit line contact pads 194A may be arranged at a constant pitch and may be each connected to any one first bit line BL11 of the plurality of first bit lines BL11 described with reference to FIG. 5. The plurality of first bit line contact pads 194A may be disposed at a constant pitch in the first horizontal direction (e.g., the X direction). As will be understood by those of skill in the art, the constant pitch between the plurality of first bit line contact pads 194A may be substantially constant, but may vary slightly due to manufacturing variations.

The plurality of second bit line contact pads 194B may be arranged at a variable pitch and may be each connected to any one second bit line BL12 of the plurality of second bit lines BL12 described with reference to FIG. 5. In the edge region MEC2, the plurality of second bit line contact pads 194B may be disposed between the plurality of second channel structures 180B and the plurality of second bit lines BL12 to connect each of the plurality of second channel structures 180B to any one of the plurality of second bit lines BL12. The plurality of second bit line contact pads 194B may be disposed at a variable pitch in the first horizontal direction (e.g., the X direction).

Figure 8:
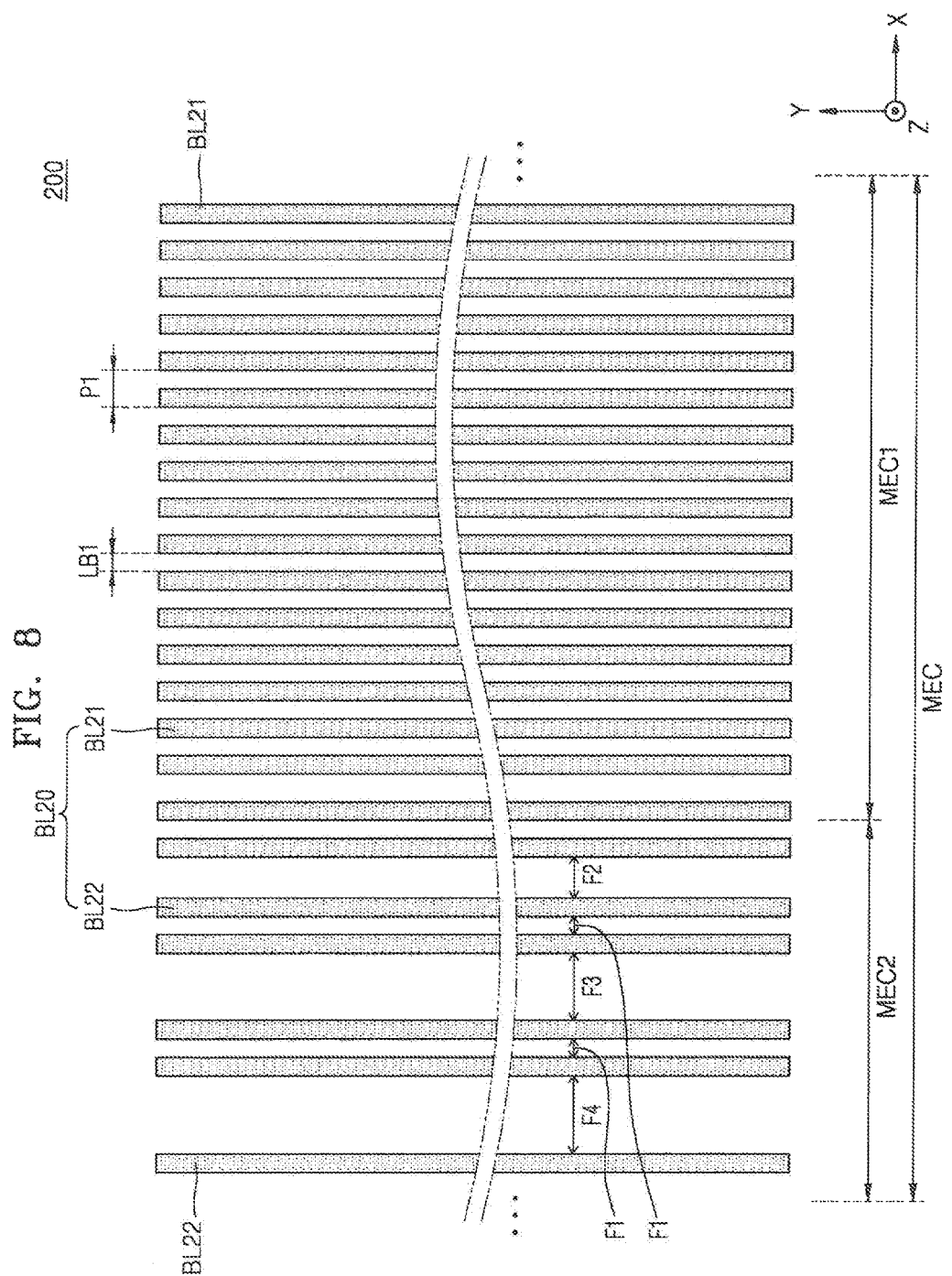

FIG. 8 illustrates a plan view showing an integrated circuit device 200 according to embodiments of the inventive concepts. FIG. 8 illustrates an example of a planar structure of some bit lines BL20 of a plurality of bit lines BL20 included in the integrated circuit device 200.

The integrated circuit device 200 may have substantially the same configuration as the integrated circuit device 100 described with reference to FIGS. 1 to 5. The plurality of bit lines BL20 included in the integrated circuit device 200 may include a plurality of linear lines extending in the second horizontal direction (e.g., the Y direction). The plurality of bit lines BL20 may include a plurality of first bit lines BL21 disposed to be parallel to each other at a first pitch P1 in the first horizontal direction (e.g., the X direction) in the center region MEC1 of the memory cell region MEC, and a plurality of second bit lines BL22 disposed to be parallel to each other at a variable pitch in the first horizontal direction (e.g., the X direction) in the edge region MEC2 of the memory cell region MEC. The plurality of first bit lines BL21 and the plurality of second bit lines BL22 may linearly extend in a respective length direction (e.g., the Y direction). A distance LB1 between two neighboring first bit lines BL21 of the plurality of first bit lines BL21 in the first horizontal direction (e.g., the X direction) may be less than a plurality of separation distances F1, F2, F3, and F4 between two neighboring second bit lines BL22 of the plurality of second bit lines BL22.

In the plurality of bit lines BL20 included in the integrated circuit device 200, the plurality of separation distances F1, F2, F3, and F4 between each two of the plurality of second bit lines BL22 in the edge region MEC2 may include the plurality of first separation distances F1 fixed as constant, and the plurality of second separation distances F2, F3, and F4 that become larger as a distance from the center region MEC1 increases. Each of the plurality of second separation distances F2, F3, and F4 may be larger than the plurality of first separation distances F1. Each of the plurality of first separation distances F1 may be disposed between two of the plurality of second separation distances F2, F3, and F4. In addition, the plurality of second separation distances F2, F3, and F4 that become larger as a distance from the center region MEC1 increases may be disposed between each two of the plurality of first separation distances F1. In some embodiments, describing a separation distance (e.g., F1) as being disposed between two other separation distances (e.g., F2, F3, and/or F4) means that two adjacent bit lines B20 of the plurality of bit lines B20 having a first distance (e.g., F1) between them are between one set of two adjacent bit lines B20 of the plurality of bit lines B20 having a second distance (e.g., F2, F3, or F4) between them and another set of two adjacent bit lines B20 of the plurality or bit lines B20 having a second distance between them (e.g., F2, F3, or F4).

FIG. 8 illustrates an example in which the plurality of second bit lines BL22 in the edge region MEC2 has any one separation distance of the plurality of first separation distance F1 that is constant regardless of a distance from the center region MEC1 and the plurality of second separation distances F2, F3, and F4 that become larger as the distance from the center region MEC1 increases. However, unlike the example of FIG. 8, the plurality of second separation distances F2, F3, and F4 of the separation distances between two of the plurality of second bit lines BL22 may be the same in the edge region MEC2 regardless of a distance from the center region MEC1. As described above, even when the plurality or second separation distances F2, F3, and F4 are the same, each of the plurality of second separation distances F2, F3, and F4 may be larger than a first separation distance F1.

The detailed configuration of the plurality of bit lines BL20 described with reference to FIG. 8 is substantially the same as that of the plurality of bit lines BL described with reference to FIGS. 1 to 5.

Figure 9:
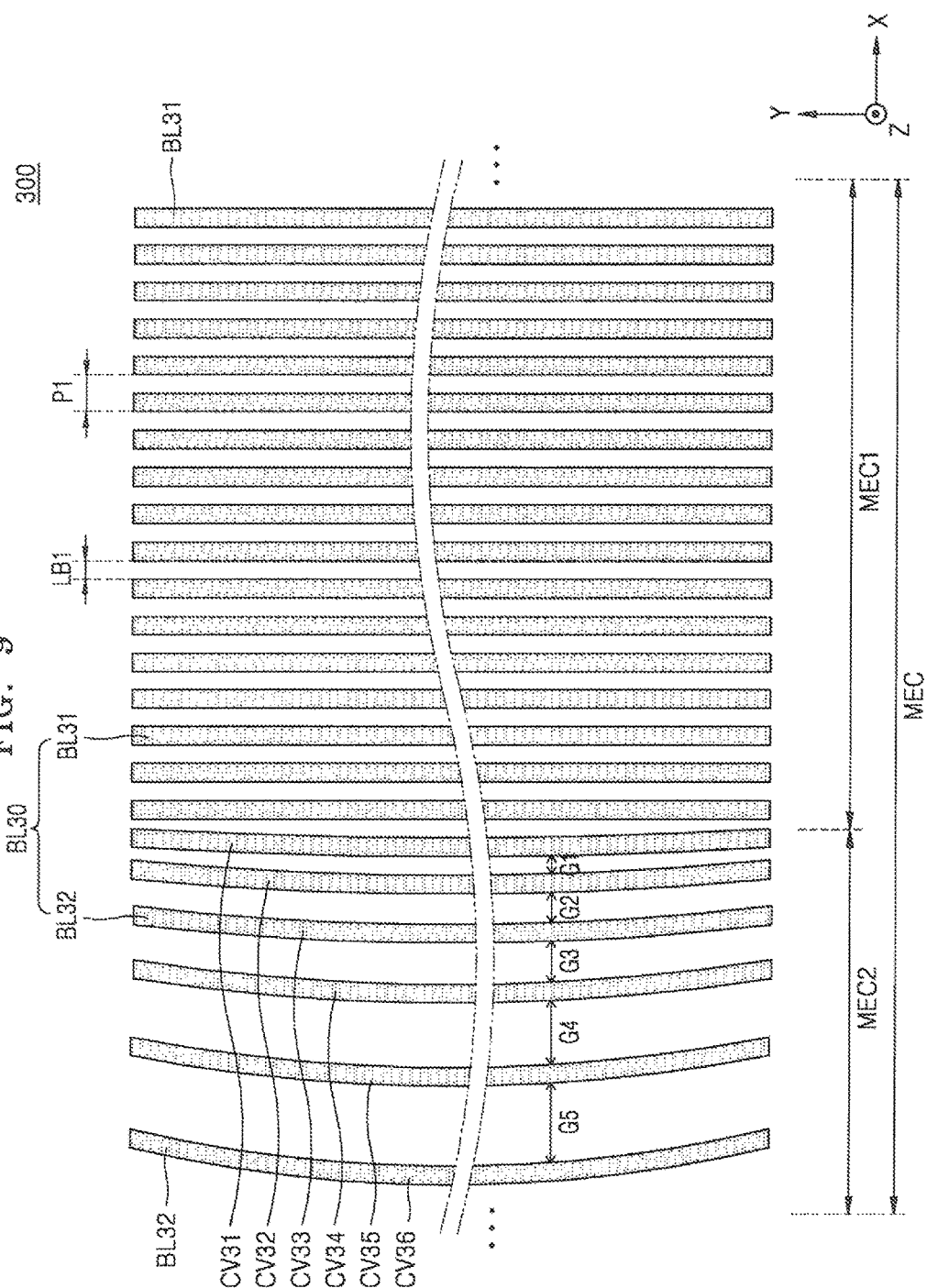

FIG. 9 illustrates a plan view showing an integrated circuit device 300 according to embodiments of the inventive concepts. FIG. 9 illustrates an example of a planar structure of some bit lines BL30 of a plurality of bit lines BL30 included in the integrated circuit device 300.

The integrated circuit device 300 may have substantially the same configuration as the integrated circuit device 100 described with reference to FIGS. 1 to 5. The plurality of bit lines BL30 included in the integrated circuit device 300 may be repeatedly arranged at a first pitch P1 in the center region MEC1 of the memory cell region MEC in the first horizontal direction (e.g., the X direction), and may include a plurality of first bit lines BL31 extending to be parallel to each other in the second horizontal direction (e.g., the Y direction) and a plurality of second bit lines BL32 arranged at a variable pitch in the first horizontal direction (e.g., the X direction) and extending in the second horizontal direction (e.g., the Y direction) in the edge region MEC2 of the memory cell region MEC. Separation distances G1, G2, G3, G4, and G5 between two of the plurality of second bit lines BL32 may become larger as a distance from the center region MEC1 increases. In the first horizontal direction (e.g., the X direction), a separation distance LB1 between two neighboring first bit lines BL31 of the plurality of first bit lines BL31 may be less than the separation distances G1, G2, G3, G4, and G5 between two neighboring second bit lines BL32 of the plurality of second bit lines BL32.

The plurality of first bit lines BL31 in the center region MEC1 may each linearly extend in a respective length direction (e.g., the Y direction), but the plurality of second bit lines BL32 in the edge region MEC2 may each nonlinearly extend in a respective length direction.

As used herein with respect to the plurality of first bit lines (e.g., BL31), the phrase "linearly extending" means that, for example, respective ones of the plurality of first bit lines BL31 extend in a substantially straight line. It will be understood by those of skill in the art that an exactly straight line is not required by the inventive concepts, as minor deviations are expected as a result of manufacturing variations. In some embodiments, the plurality of second bit lines BL32 extending nonlinearly means that an extending line of respective ones of the plurality of second bit lines BL32 in the second horizontal direction (e.g., the Y direction) deviates from a substantially straight line. In some embodiments, respective ones of the plurality of second bit lines BL32 may be curved or turned in a particular direction. With respect to the plurality of second bit lines BL32, extending nonlinearly is intended to include bit lines that are intentionally configured to be nonlinear, and to exclude bit lines that are nonlinear as a result of manufacturing deviations from a linear design.

The plurality of second bit lines BL32 may include convex curved portions CV31, CV32, CV33, CV34, CV35, and CV36 in a direction away from the center region MEC1, that is, a direction toward the connection region CON (see FIG. 1). The radius of curvature of the curved portions CV31, CV32, CV33, CV34, CV35, and CV36 may become smaller as a distance from the center region MEC1 increases.

In some embodiments, the separation distances G1, G2, G3, G4, and G5 between pairs of the plurality of second bit lines BL32 may become smaller as a distance to ones of a pair of word line cut regions WLC in the second horizontal direction (e.g., the Y direction) of the memory cell region MEC decreases (see FIG. 1). In some embodiments, the separation distances G1, G2, G3, G4, and G5 between pairs of the plurality of second bit lines BL32 may be constant regardless of a distance from a pair of word line cut regions WLC in the second horizontal direction (e.g., the Y direction).

The detailed description of the plurality of bit lines BL30 described with reference to FIG. 9 is substantially the same as that of the plurality of bit lines BL described with reference to FIGS. 1 to 5.

Figure 10:
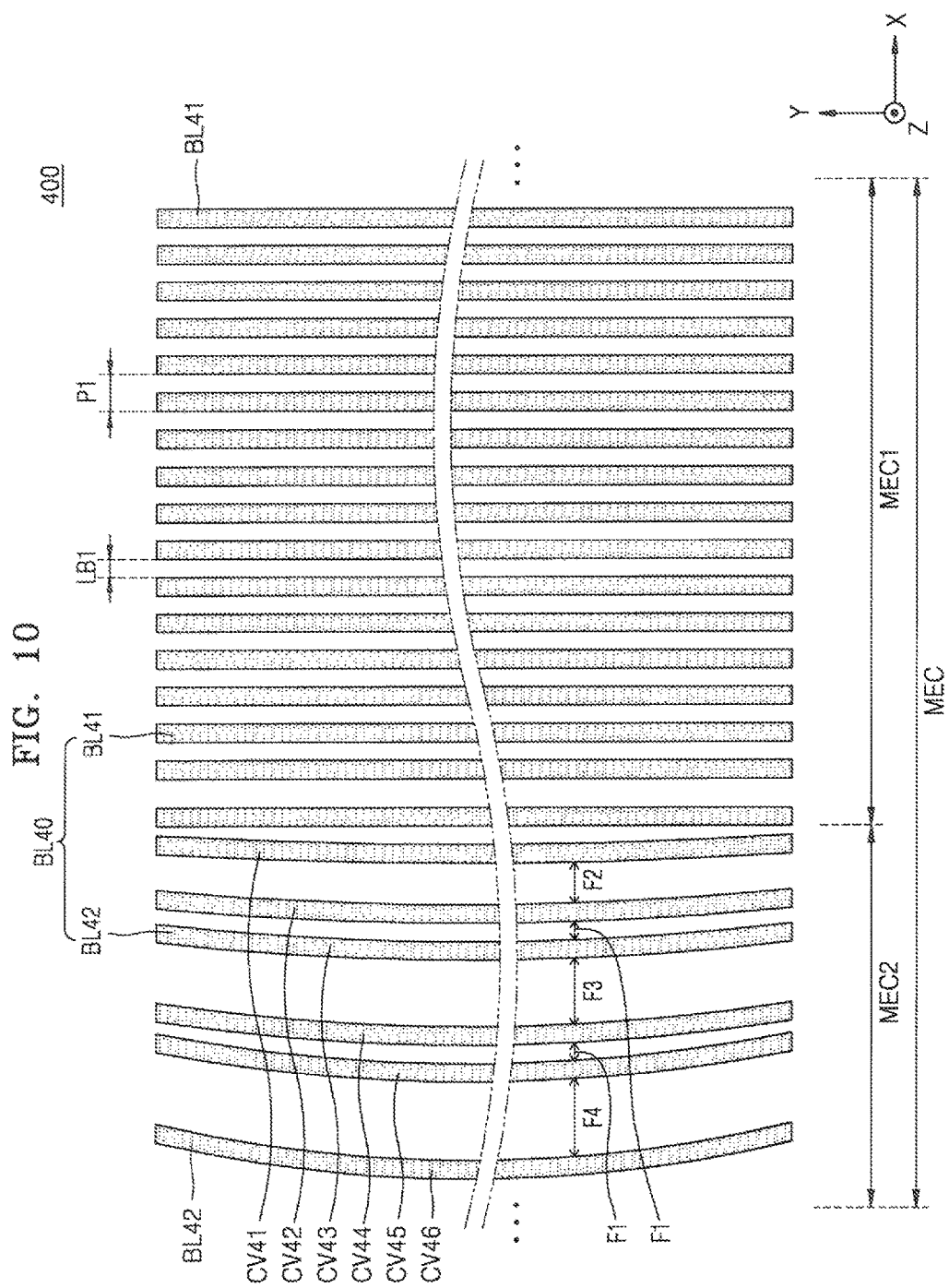

FIG. 10 illustrates a plan view showing an integrated circuit device 400 according to embodiments of the inventive concepts. FIG. 10 illustrates a planar structure of some bit lines BL40 of a plurality of bit lines BL40 included in the integrated circuit device 400.

The integrated circuit device 400 may have substantially the same configuration as the integrated circuit device 200 described with reference to FIG. 8. The plurality of bit lines BL40 included in the integrated circuit device 400 may be repeatedly arranged at a constant first pitch P1 in the center region MEC1 of the memory cell region MEC in the first horizontal direction (e.g., the X direction) and may include a plurality of first bit lines BL41 extending to be parallel to each other in the second horizontal direction (e.g., the Y direction) and a plurality of second bit lines BL42 arranged at a variable pitch in the edge region MEC2 of the memory cell region MEC in the first horizontal direction (e.g., the X direction) and extending in the second horizontal direction (e.g., the Y direction). A plurality of separation distances F1, F2, F3, and F4 between two of the plurality of second bit lines BL42 in the edge region MEC2 may include the plurality of first separation distance F1 fixed as constant and the plurality of second separation distances F2, F3, and F4 that become larger as a distance from the center region MEC1 increases.

The plurality of first bit lines BL41 in the center region MEC1, of the plurality of bit lines BL40, may each linearly extend in a respective length direction (e.g., the Y direction), but the plurality of second bit lines BL42 in the edge region MEC2 may each nonlinearly extend in a respective length direction. The plurality of second bit lines BL42 may include convex curved portions CV41, CV42, CV43, CV44, CV45, and CV46 in a direction away from the center region MEC1, that is, a direction toward the connection region CON (see FIG. 1). The radius of curvature of the curved portions CV41, CV42, CV43, CV44, CV45, and CV46 may become smaller as a distance from the center region MEC1 increases.

In some embodiments, the plurality of separation distances F1, F2, F3, and F4 between pairs of the plurality of second bit lines BL42 may become smaller in the first horizontal direction (e.g., the X direction) as a distance in the second horizontal direction (e.g., the Y direction) to ones of a pair of word line cut regions WLC decreases. In some embodiments, the plurality of separation distances F1, F2, F3, and F4 between pairs of the plurality of second bit lines BL42 may be constant in the second horizontal direction (e.g., the Y direction) regardless of a distance from a pair of word line cut regions WLC.

FIG. 10 illustrates an example in which the plurality of second bit lines BL42 in the edge region MEC2 having any one separation distance of the plurality of first separation distance F1 being constant regardless of a distance from the center region MEC1 and the plurality of second separation distances F2, F3, and F4 that become larger as a distance from the center region MEC1 increases while being arranged at a variable pitch. However, unlike the description of FIG. 10, the plurality of second separation distances F2, F3, and F4 between the plurality of second bit lines BL42 in the edge region MEC2 may be the same regardless of a distance from the center region MEC1. As described above, even when the plurality of second separation distances F2, F3, and F4 are the same, each of the plurality of second separation distances F2, F3, and F4 may be larger than the first separation distance F1.

Detailed configuration of the plurality of bit lines BL40 described with reference to FIG. 10 is substantially the same as that of the plurality of bit lines BL described with reference to FIGS. 1 to 5.

Figure 11:
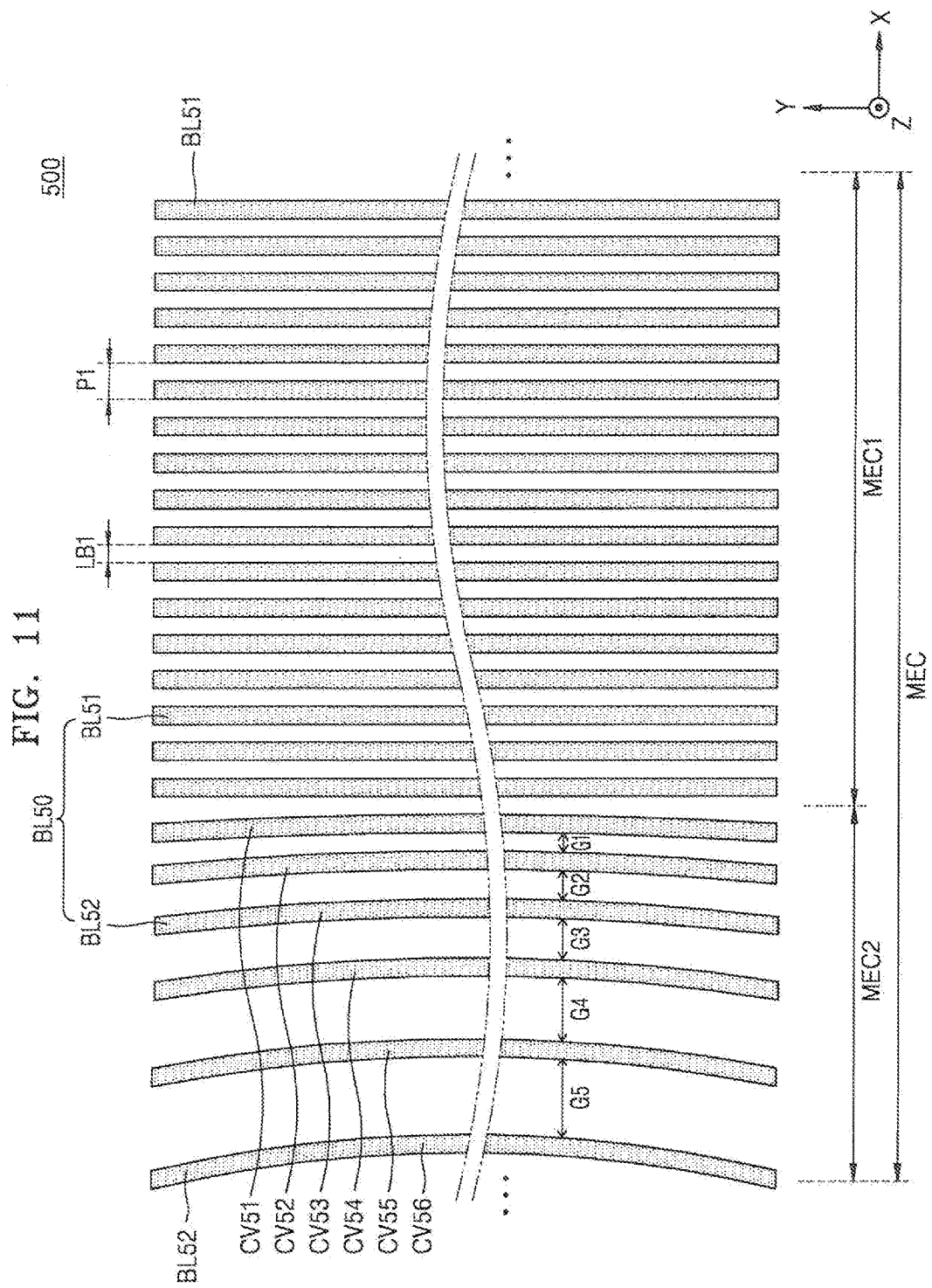

FIG. 11 illustrates a plan view showing an integrated circuit device 500 according to embodiments of the inventive concepts. FIG. 11 illustrates an example of a planar structure of some bit lines BL50 of a plurality of bit lines BL50 included in the integrated circuit device 500.

The integrated circuit device 500 may have substantially the same configuration as the integrated circuit device 300 described with reference to FIG. 9. The plurality of bit lines BL50 included in the integrated circuit device 500 may include a plurality of first bit lines BL51 arranged to be parallel to each other at a constant first pitch P1 in the center region MEC1 of the memory cell region MEC in the first horizontal direction (e.g., the X direction) and extending in the second horizontal direction (e.g., the Y direction), and a plurality of second bit lines BL52 arranged at a variable pitch in the edge region MEC2 of the memory cell region MEC in the first horizontal direction (e.g., the X direction) and extending in the second horizontal direction (e.g., the Y direction). Separation distances G1, G2, G3, G4, and G5 between two of the plurality of second bit lines BL52 may become larger as a distance from the center region MEC1 increases.

The plurality of second bit lines BL52 in the edge region MEC2 may include convex curved portions CV51, CV52, CV53, CV54, CV55, and CV56 in a direction toward the center region MEC1, that is, a direction away from the connection region CON (see FIG. 1). The radius of curvature of the curved portions CV51, CV52, CV53, CV54, CV55, and CV56 may be smaller as a distance from the center region MEC1 increases.

Detailed configuration of the plurality of bit lines BL50 described with reference to FIG. 11 may substantially the same as that of the plurality of bit lines BL described with reference to FIGS. 1 to 5.

FIG. 12 illustrates a plan view showing an integrated circuit device 600 according to embodiments of the inventive concepts. FIG. 12 illustrates an example of a planar structure of some bit lines BL60 of a plurality of bit lines BL60 included in the integrated circuit device 600.

The integrated circuit device 600 may have substantially the same configuration as the integrated circuit device 400 described with reference to FIG. 10. The plurality of bit lines BL60 included in the integrated circuit device 600 may include a plurality of first bit lines BL61 arranged to be parallel to each other at a constant first pitch P1 in the center region MEC1 of the memory cell region MEC in the first horizontal direction (e.g., the X direction) and extending in the second horizontal direction (e.g., the Y direction), and a plurality of second bit lines BL62 arranged at a variable pitch in the edge region MEC2 of the memory cell region MEC in the first horizontal direction (e.g., the X direction) and extending in the second horizontal direction (e.g., the Y direction). A plurality of separation distances F1, F2, F3, and F4 between two of the plurality of second bit lines BL62 in the edge region MEC2 may include the plurality of first separation distance F1 fixed as constant, and the plurality of second separation distances F2, F3, and F4 that become larger as a distance from the center region MEC increases.

The second bit lines BL62 in the edge region MEC2 from, among the plurality of bit lines BL60, may include convex curved portions CV61, CV62, CV63, CV64, CV65, and CV66 in a direction toward the center region MEC1, that is, a direction away from the connection region CON (see FIG. 1). The radius of curvature of the curved portions CV61, CV62, CV63, CV64, CV65, and CV66 may become smaller as a distance from the center region MEC1 increases.

A detailed configuration of the plurality of bit lines BL60 described with reference to FIG. 12 is substantially the same as that of the plurality of bit lines BL described with reference to FIGS. 1 to 5.

The plurality of bit lines BL, BL20, BL30, BL40, BL50, and BL60 included in the integrated circuit devices 100, 200, 300, 400, 500 and 600 according to the inventive concepts that are described with reference to FIGS. 1 to 12 may include the plurality of first bit lines BL11, BL21, BL31, BL42, BL51, and BL61 arranged to be parallel to each other at a constant pitch in the center region MEC1 of the memory cell region MEC, and the plurality of second bit lines BL12, BL22, BL32, BL42, BL52, and BL62 extending at a variable pitch in the edge region MEC2 of the memory cell region MEC. Thus, even when warpage of structures on the substrate 102 occurs due to the physical stress or the distances between the channels extending vertically on the substrate 102 not being constant, depending on the position of the memory cell region as the number of word lines stacked in the memory cell region MEC increases, the number of the bit lines BL, BL20, BL30, BL40, BL50, and BL60 passing through the memory cell region MEC is maximized while minimizing the number of dummy channels that do not contribute to the operation of the actual device in the memory cell region MEC, thereby suppressing an undesirable increase in a chip size due to the dummy channel and improving the integration degree of the vertical memory device.

FIGS. 13A to 13E illustrate cross-sectional views sequentially showing, a method of manufacturing a integrated circuit device according to embodiments of the inventive concepts. Herein, a method of manufacturing the integrated circuit device 100 described with reference to FIGS. 1 to 5 will be described. FIGS. 13A to 13E illustrate configurations of the cross-sectional view taken along a line X-X' of FIG. 1, according to a method of manufacturing the integrated circuit device 100.

Referring to FIG. 13A, a device isolation film (not shown) for defining the active region AC may be formed on the substrate 102, and then a plurality of insulating films 176 and a plurality of sacrificial films PL may be alternately stacked on the substrate 102.

The plurality of insulating films 176 may include, for example, silicon oxide, silicon nitride, and/or silicon oxynitride. The plurality of sacrificial films PL may include, for example, silicon nitride, silicon carbide, and/or polysilicon. The plurality of sacrificial films PL may secure a respective space for forming at least one ground selection line GSL, a plurality of word lines WL: WL1, WL2, ..., WLn-1, WLn, and at least one string selection line SSL in the subsequent processes.

Figure 13B:
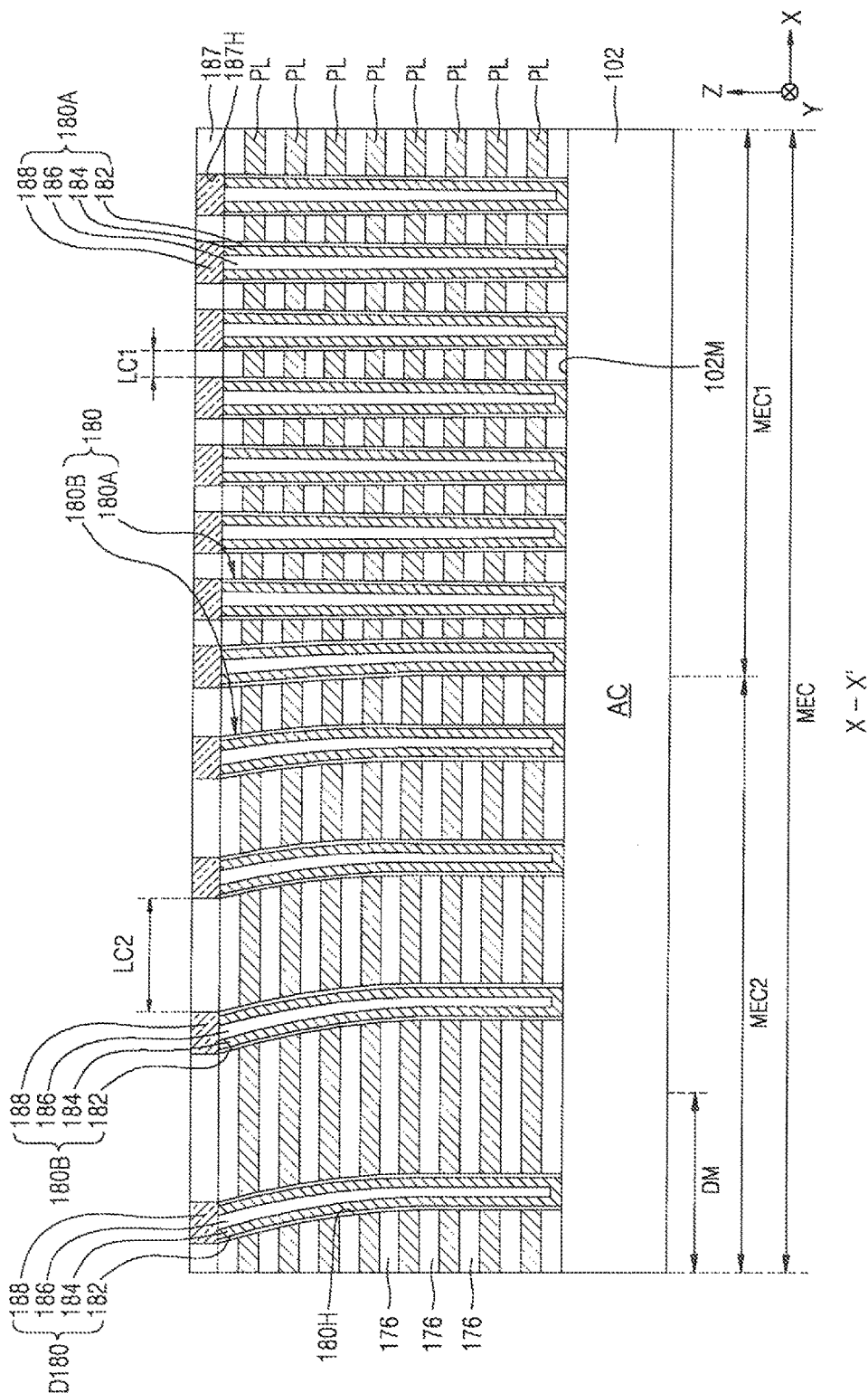

Referring to FIG. 13B, a plurality of channel holes 180H passing through the plurality of insulating films 176 and the plurality of sacrificial films PL extending in the vertical direction (e.g., the Z direction) may be formed, and then the plurality of the gate dielectric films 182, the channel regions 184, and the buried insulating films 186 may be formed in each inner portion of channel holes 180H. Next, the insulating film 187 may be formed to cover each upper surface of the gate dielectric film 182, the channel region 184, and the buried insulating film 186, and a plurality of contact holes 187H exposing upper surfaces of the channel region 184 and the buried insulating film 186 may be formed on the insulating film 187, and then a plurality of drain regions 188 may be formed within the plurality of contact holes 187H. As a result, the plurality of first channel structures 180A disposed in the center region MEC1 of the memory cell region MEC, the plurality of second channel structures 180B disposed in the edge region MEC2 of the memory cell region MEC, the plurality of dummy channel structures D180 disposed in the dummy channel region DM of the edge region MEC2, and the plurality of dummy channel structures S180 (see. FIG. 1) disposed in the connection region CON may be concurrently formed.

While forming the plurality of first channel structures 180A, the plurality of second channel structures 180B, the plurality of dummy channel structures D180, and the plurality of dummy channel structures S180 (see FIG. 1), the relatively large stress and thermal budget are selectively applied to the plurality of channel structures 180 formed in the memory cell region MEC having a relatively large pattern density, and thus, the plurality of second channel structures 180B disposed in the edge region MEC2 of the memory cell region MEC may have a structure that non linearly extends in the vertical direction (e.g., the Z direction). As a result, in the first horizontal direction (e.g., the X direction), a first separation distance LC1 between surfaces of two neighboring first channel structures 180A of the plurality of first channel structures 180A disposed in the center region MEC1 may be less than a second separation distance LC2 between surfaces of two neighboring second channel structures 180B of the plurality of second channel structures 180B disposed in the edge region MEC2.

The gate dielectric film 182 may be formed to cover an inner sidewall of each of the plurality of channel holes 180H.

An outer sidewall of the channel region 184 may contact the gate dielectric film 182. The channel region 184 may include, for example, polysilicon doped with impurities. The channel region 184 may be formed by, for example, a chemical vapor deposition (CVD) process, a low pressure CVD (LPCVD) process, or an atomic layer deposition (ALD) process. In some embodiments, as described with reference to FIG. 13B, the channel region 184 may be formed to contact the substrate 102 exposed in a bottom portion of a channel hole 180H. In some embodiments, a semiconductor layer (not shown) formed by a selective epitaxial growth process may be formed on the substrate 102 exposed in the bottom portion of the channel hole 180H, and the channel region 184 may be formed on the semiconductor layer.

The buried insulating film 186 may be formed, for example, by a CVD process, a LPCVD process, or an ALD process, using an insulating material such as silicon oxide, nitride or silicon oxynitride.

The insulating film 187 may be formed to have a planarized upper surface over the memory cell region MEC and the connection region CON. A plurality of the drain regions 188 may include, for example, polysilicon doped with impurities, a metal, conductive metal nitride, or a combination thereof. Examples of metals that may constitute the plurality of drain regions 188 include tungsten, nickel, cobalt, tantalum, or the like.

Figure 13C:
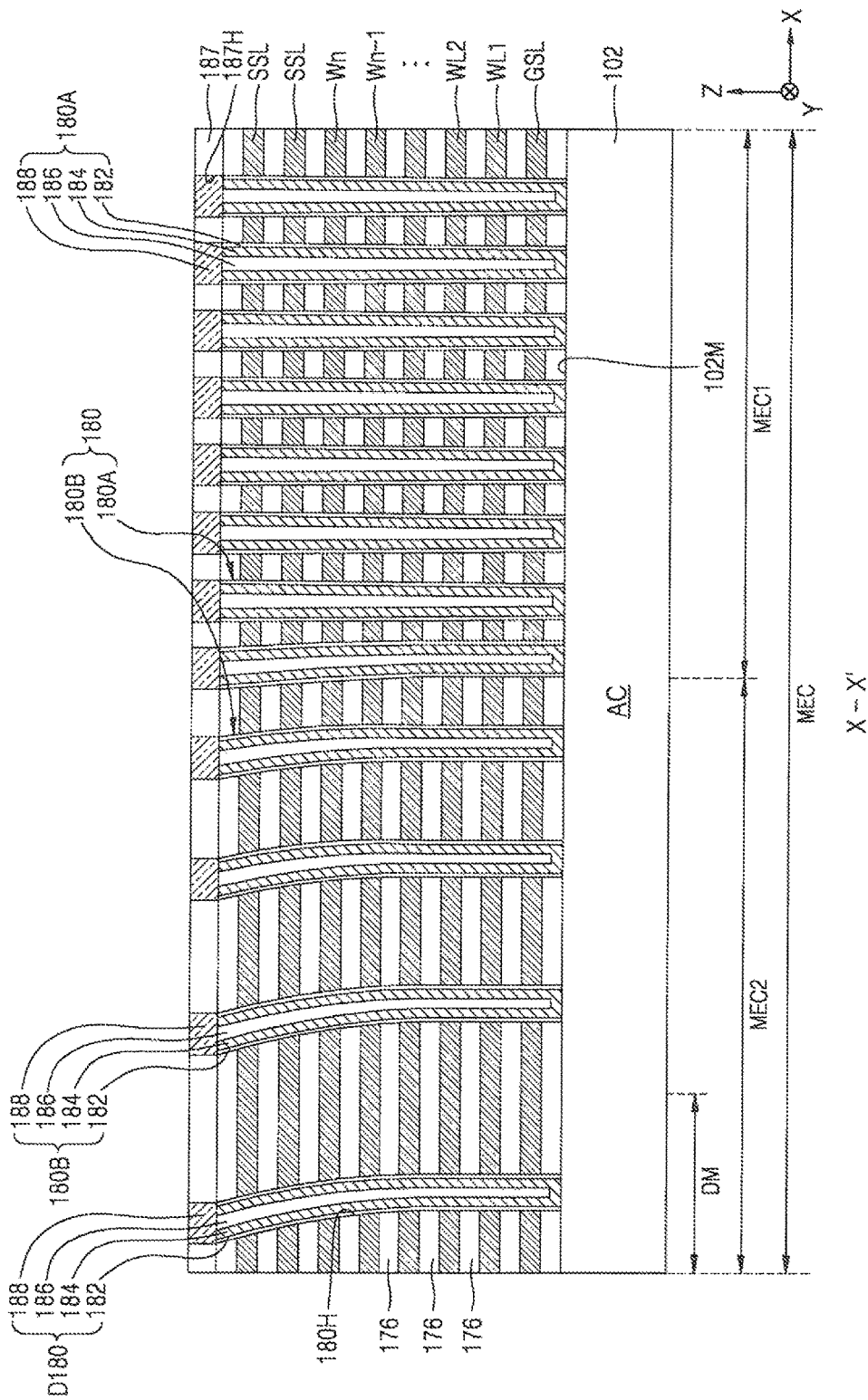

Referring to FIG. 13C, the plurality of word fine cut regions WLC (see FIG. 1) passing through the plurality of insulating films 176 and the plurality of sacrificial films PL (see FIG. 13B) and exposing the substrate 102 may be formed, and then impurity ions are implanted into the substrate 102 through the plurality of word line cut regions WLC to form the plurality of common source regions 172, and then the plurality of sacrificial films PL (see FIG. 13B) are replaced with at least one ground selection line GSL, the plurality of word lines WL: WL1, WL2, . . . , WLn-1, WLn, and at least one string selection line SSL.

In some embodiments, when the plurality of sacrificial films PL include polysilicon, in order to replace the plurality of sacrificial films PL (see FIG. 13B) with at least one ground selection line GSL, the plurality of word lines WL: WL1, WL2, . . . , WLn-1, WLn, and at least one string selection line SSL, a silicidation process may be performed on the plurality of sacrificial films PL. In this case, at least one ground selection line GSL, the plurality of word lines WL: WL1, WL2, . . . , WLn-1, WLn, and at least one string selection line SSL may each include, for example, tungsten silicide, tantalum silicide, cobalt silicide, or nickel silicide.

In some embodiments, the plurality of sacrificial films PL (see FIG. 13B) exposed through the plurality of word line cut regions WLC are selectively removed to secure empty spaces between adjacent pairs of the plurality of insulating films 176, and a conductive material may fill the empty spaces to form at least one ground selection line GSL, the plurality of word lines WL: WL1, WL2, . . . , WLn-1, WLn, and at least one string selection line SSL. In this case, at least one ground selection line GSL the plurality of word lines WL: WL1, WL2, . . . , WLn-1, WLn, and at least one string selection line SSL may include a metal material such as, for example, tungsten, tantalum, cobalt, or nickel.

Then, an insulating spacer 192 and the common source line CSL may be formed in an inner portion of each of the plurality of word line cut regions WLC (see FIG. 1). The insulating spacer 192 may include, for example, silicon oxide, silicon nitride, silicon oxynitride, and/or low dielectric material. For example, the insulating spacer 192 may include, for example, $SiO_2$, $Si_3N_4$, SiON, SiOCN, SiCN, or a combination thereof. The common source line CSL may include, for example: a metal such as tungsten, copper, or aluminum; conductive metal nitride such as titanium nitride or tantalum nitride; a transition metal such as titanium or tantalum or a combination thereof.

In some embodiments, in order to form the insulating spacer 192 in an inner portion of each of the plurality of word line cut regions WLC, an insulating film covering an inner wall of the plurality of word line cut regions may be formed. Then, at a lower surface of the plurality of word line cut regions WLC, the insulating film may be etched back to expose the substrate 102 to form the insulating spacer 192, which includes a portion of the insulating film remaining on the inner sidewall of the plurality of word line cut regions WLC. In order to form the common source line CSL in the inner portion of each of the plurality of word line cut regions WLC, within the plurality of word line cut regions WLC, a space defined by the insulating spacer 192 may be filled with a conductive material to form a conductive layer in an inner portion of the plurality of word line cut regions WLC and on an upper portion of the insulating film 187. Next, in order to expose an upper surface of the insulating film 187, portions of the conductive layer which are in an outer portion of the plurality of word line cut regions WLC may be removed by chemical mechanical polishing (CMP) or etch-back so that the conductive layer remains only in the inner portion of the plurality of word line cut regions WLC. In some embodiments, a metal silicide film (not shown) may be interposed between a common source region 172 and the common source line CSL to reduce the contact resistance. For example, the metal silicide film may include, but is not limited to, cobalt silicide.

In the connection region CON (see FIG. 1), a plurality of conductive contact plugs (not shown) passing through the insulating film 187 and at least one the insulating film 176 in the vertical direction and connected to each of at least one ground selection line GSL, the plurality of word lines WL: WL1, WL2, . . . , WLn-1, WLn, and at least one string selection line SSL may be formed. By using the plurality of conductive contact plugs, at least one ground selection line GSL, the plurality of word lines WL: WL1, WL2, . . . , WLn-1, WLn, and at least one string selection line SSL may be connected to an upper wiring layer (not shown) to be formed in the subsequent process.

Figure 13D:
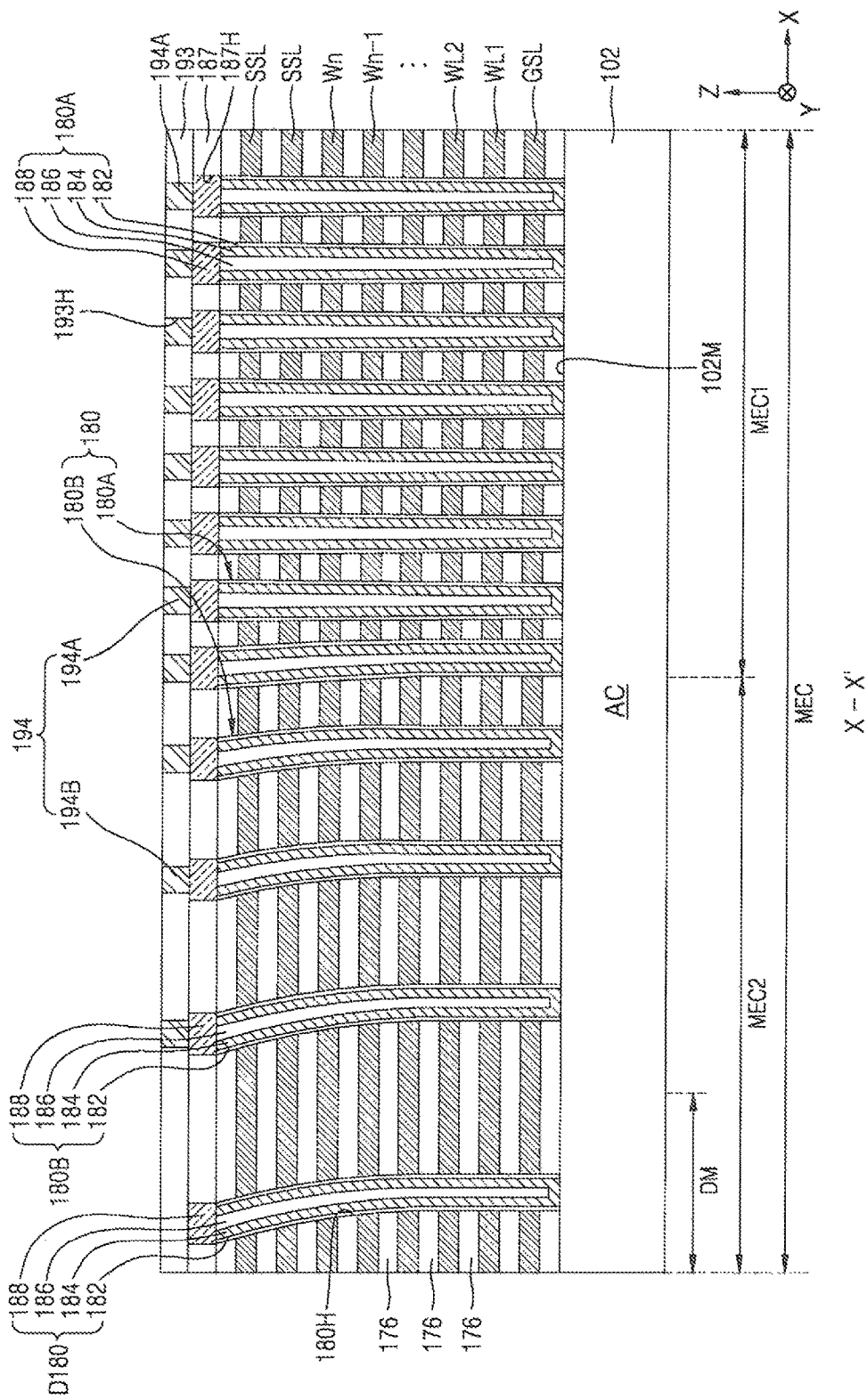

Referring to FIG. 13D, the insulating film 193 covering the plurality of common source lines CSL, the plurality of first channel structures 180A, the plurality of second channel structures 180B, the plurality of dummy channel structures D180, and the plurality of dummy channel structures S180 (see FIG. 1) may be formed, and then a portion of the insulating films 193, 187, and 176 and a portion of the string selection line SSL may be removed to form the string selection line cut region SSLC (see FIGS. 1, 2B, and 3B) and fill the string selection line cut region SSLC with the insulating film 174.

A plurality of bit line contact holes 193H passing through some regions of the insulating film 193 may be formed and the plurality of bit line contact holes 193H may be filled with a conductive material to form the plurality of first hit line contact pads 194A and the plurality of second bit line contact pads 194B.

Referring to FIG. 13E, the insulating film 195 covering an upper surface of the insulating film 193 and upper surfaces of the plurality of first bit line contact pads 194A and the plurality of second bit line contact pads 194B may be formed, and then the plurality of bit lines BL passing through the insulating film 195 and connected to the plurality of first bit line contact pads 194A and the plurality of second bit line contact pads 194B may be formed.

The plurality of bit lines BL may be formed by using a photolithography process. For example, in order to form the plurality of bit lines BL having a fine line width of several tens of nanometers or smaller, a fine pattern technology such as double patterning technology (DPT), triple patterning technology (TPT), or quadruple patterning technology (QPT) may be used. In some embodiments, in the edge region MEC2 as described with reference to FIG. 5, the insulating film 195 may be etched using an etch mask pattern (not shown) covering portions corresponding to the separation distances G1, G2, G3, G4,and G5 of the insulating film 195 to form a plurality of holes 195H in the insulating film 195, and then the plurality of holes 195H may be filled with a conductive material to form the plurality of bit lines BL so that the separation distances G1, G2, G3, G4,and G5, in the first horizontal direction (e.g., the X direction), between each two of the plurality of second bit lines BL12 become larger as a distance from the center region MEC1 increases. In order to form the etch mask pattern, a single etch mask layer or a multiple etch mask layer including materials having different etch selectivity ratios may be used. In order to form the etch mask pattern, a photolithography process using, for example, DPT, TPT, QPT, or the like may be used. In the photolithography process, Krf excimer laser (248 nm), ArF excimer laser (193 nm), $F_2$ excimer laser (157 nm), or extreme ultraviolet (EUV) (13.5 nm) may be used as a light source.

The method of manufacturing the integrated circuit device 100 described with reference to FIGS. 1 to 5 is described above with reference to FIGS. 13A to 13E, but one of ordinary skill in the art would understand that the integrated circuit devices 200, 300, 400, 500, and 600 including the plurality of bit lines BL20, BL30, BL40, BL50, and BL60 described with reference to FIGS. 8 to 12 and integrated circuit devices including various structures modified and changed therefrom within the scope of the inventive concepts may be manufactured by being modified and changed from the aforementioned descriptions within the scope of the inventive concepts.

In particular, in an embodiment of forming the plurality of bit lines BL20 included in the integrated circuit device 200 of FIG. 8, by using DPT, the plurality of first bit lines BL21 repeatedly arranged at the constant first pitch P1 in the first horizontal direction (e.g., the X direction) in the center region MEC1 of the memory cell region MEC may be formed, the plurality of second bit lines BL22 repeatedly arranged at a variable pitch in the first horizontal direction (e.g., the X direction) in the edge region MEC2 of the memory cell region MEC may be formed, and the plurality of second bit lines BL22 in the edge region MEC2 may be formed to include the plurality of first separation distance F1 fixed as constant and the plurality of second separation distances F2, F3, and F4 that become larger as a distance from the center region MEC increases between each two of the plurality of second bit lines BL22.

Figure 14:
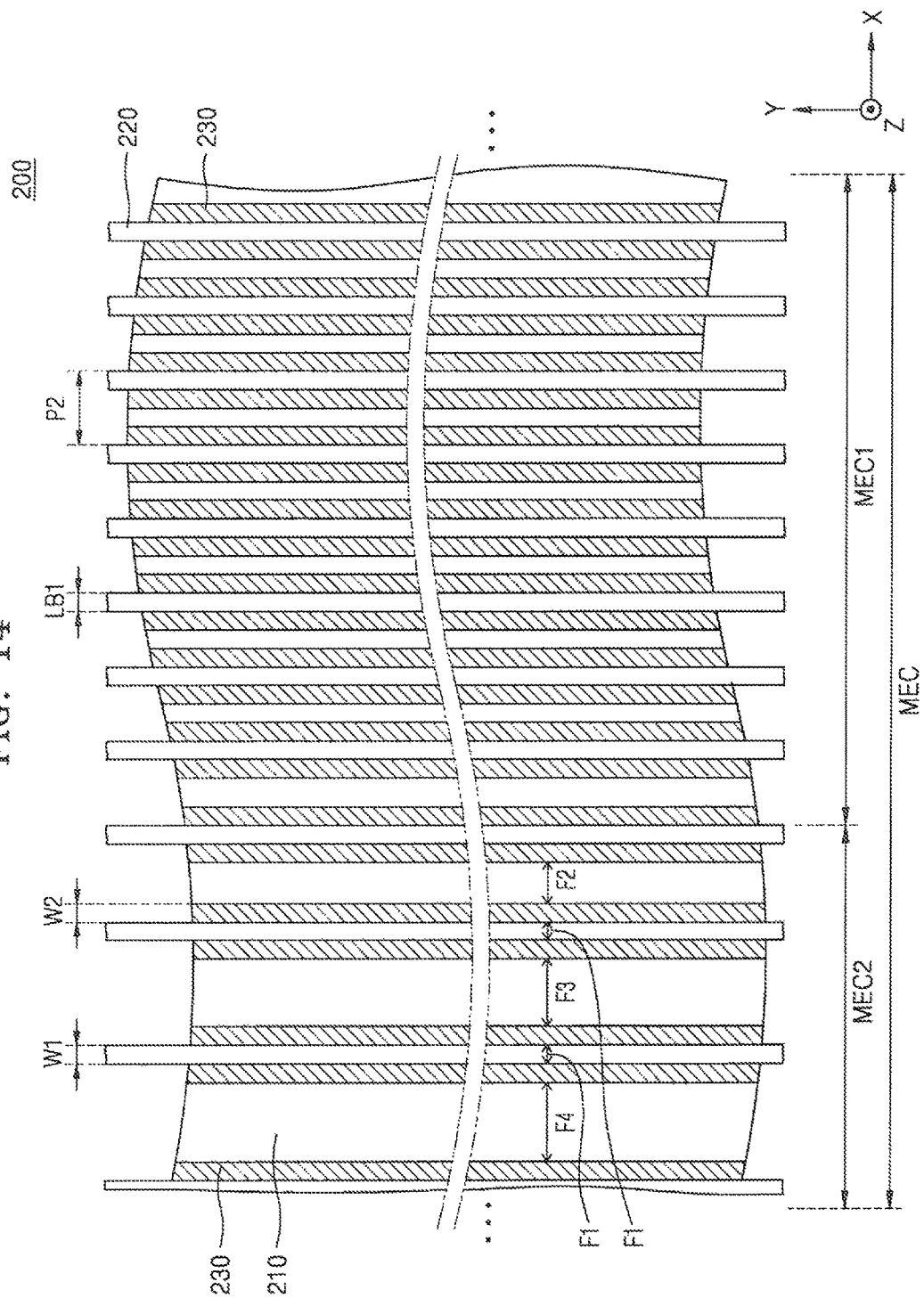
FIG. 14 illustrates a cross-sectional view showing a method of manufacturing an integrated circuit device, according to embodiments of the inventive concepts.

In detail, the insulating film 195 may be formed on a result of the process in FIG. 13D, and as illustrated in FIG. 14, a conductive layer 210 may be formed on the insulating film 195 by using a photolithography process, and the plurality of sacrificial film patterns 220 having a first width W1 that has substantially the same size as the first separation distance F1 may be formed on the conductive layer 210. The first width W1 may be the same as a distance LB1 between two neighboring first bit lines BL21 of the plurality of first bit lines BL21. The plurality of sacrificial film patterns 220 may be arranged at a second pitch P2 that is twice the first pitch P1 (see FIG. 8) in the center region MEC1 of the memory cell region MEC in the first horizontal direction (e.g., the X direction) and may be arranged at a variable pitch in the edge region MEC2 in the first horizontal direction (e.g., the X direction).

Then, a plurality of spacer sacrificial patterns 230 covering both sidewalls of each of the plurality of sacrificial film patterns 220 may be formed on the conductive layer 210. A second width W2 of the plurality of spacer sacrificial patterns 230 may be the same as a width of respective ones of the plurality of bit lines BL20 in the first horizontal direction (e.g., the X direction). In the center region MEC1 of the memory cell region MEC, the plurality of spacer sacrificial patterns 230 may be repeatedly arranged at the constant first pitch P1 (see FIG. 8) in the first horizontal direction (e.g., the X direction). In the edge region MEC2 of the memory cell region MEC, the plurality of spacer sacrificial patterns 230 may be repeatedly arranged at a variable pitch in the first horizontal direction (e.g., the X direction), and the plurality of separation distances between each two of the plurality of spacer sacrificial patterns 230 may include the plurality of first separation distance F1 fixed as constant, and the plurality of second separation distances F2, F3, and F4 that become larger as a distance from the center region MEC1 increases.

Then, the plurality of sacrificial film patterns 220 may be removed, the plurality of spacer sacrificial patterns 230 may be used as an etch mask to etch the conductive layer 210 and to form a conductive pattern (not shown) having a planar shape corresponding to a planar shape of the plurality of bit lines BL20 of FIG. 8, and then the plurality of bit lines BL20 may be obtained from the conductive pattern.

An example of forming the plurality of bit lines BL20 of FIG. 8 is described with reference to FIG. 14, but the inventive concepts are not limited thereto. The plurality of bit lines BL20 of FIG. 8 may be formed by using a method modified and changed from the aforementioned method.

As described with reference to FIGS. 9 to 12, in order to form the plurality of bit lines BL30, BL40, BL50, and BL60 including the plurality of second bit line patterns BL32, BL42, BL52, and BL62 having a curved portion, after forming a plurality of sacrificial film patterns (not shown) that include a curved portion corresponding to the curved portion included in the plurality of second bit line patterns BL32, BL42, BL52, and BL62 instead of the plurality of sacrificial film patterns 220 of FIG. 14, various processes similar to, or modified and changed from the process described with reference to FIG. 14 may be performed by using the plurality of sacrificial film patterns including the curved portion.

As described above, in an integrated circuit device according to the inventive concepts, even when warpage of structures on the substrate occurs due to the physical stress or the distances between the channels extending vertically on the substrate not being constant, depending on the position of the memory cell region as the number of word lines stacked in the memory cell region of a vertical memory device increases, the number of the bit lines passing through the memory cell region is increased and/or maximized while decreasing and/or minimizing the number of dummy channels that do not contribute to the operation of the actual device in the memory cell region, thereby suppressing an undesirable increase in a chip size due to the dummy channel and improving the integration degree of the vertical memory device, It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items, Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
a plurality of word lines extending parallel to a main surface of a substrate and overlapping each other in a vertical direction, on the substrate,
a plurality of channel structures extending in the vertical direction through the plurality of word lines on an area of the substrate,
a plurality of bit line contact pads on the plurality of channel structures, and
a plurality of bit lines connected to the plurality of channel structures through the plurality of bit line contact pads on the area,
wherein the plurality of bit lines comprise
a plurality of first bit lines extending parallel to each other at a first pitch in a center region of the area, and
a plurality of second bit lines extending at a second pitch in an edge region of the area, the second pitch being different from the first pitch.

2. The integrated circuit device of claim 1, wherein the plurality of first bit lines and the plurality of second bit lines extend linearly.

3. The integrated circuit device of claim 1, wherein the first pitch is a constant pitch and the second pitch is a variable pitch, and
wherein at least some separation distances of a plurality of separation distances between adjacent ones of the plurality of second bit lines increase with increasing distance from the center region of the area.

4. The integrated circuit device of claim 1, wherein the first pitch is a constant pitch and the second pitch is a variable pitch, and
wherein a plurality of separation distances between adjacent ones of the plurality of second bit lines comprise a first separation distance regardless of a distance from the center region of the area, and a plurality of second separation distances that increase with increasing distance from the center region of the area.

5. The integrated circuit device of claim 1, wherein the plurality of channel structures comprise a nonlinear channel structure having a sidewall extending along a non-planar surface in the vertical direction in the edge region of the area.

6. The integrated circuit device of claim 1, wherein the plurality of first bit lines extend linearly in the center region, and
wherein the plurality of second bit lines extend nonlinearly in the edge region.

7. The integrated circuit device of claim 1, wherein the plurality of bit line contact pads comprise:
a plurality of first bit line contact pads arranged at a constant pitch in the center region of the area; and
a plurality of second bit line contact pads arranged at a variable pitch in the edge region of the area.

8. The integrated circuit device of claim 1, further comprising
a plurality of common source lines extending parallel to each other in a first horizontal direction and being within a plurality of word line cut regions defining a width of the plurality of word lines in a second horizontal direction perpendicular to the first horizontal direction,
wherein the plurality of bit lines extend in the second horizontal direction.

9. The integrated circuit device of claim 6, wherein at least some second bit lines of the plurality of second bit lines comprise a convex curved portion in a direction away from the center region of the area.

10. The integrated circuit device of claim 6, wherein at least some second bit lines of the plurality of second bit lines comprise a convex curved portion in a direction toward the center region of the area.

11. An integrated circuit device comprising:
a plurality of word lines extending parallel to a main surface of a substrate and overlapping each other in a vertical direction perpendicular to the main surface, the substrate having a memory cell region and a connection region sequentially arranged in a first horizontal direction,
a plurality of word line cut regions extending in the first horizontal direction and defining a width of the plurality of word lines in a second horizontal direction perpendicular to the first horizontal direction,
a plurality of channel structures extending in the vertical direction through the plurality of word lines in the memory cell region, and
a plurality of bit lines arranged on the plurality of channel structures in the memory cell region,
wherein the plurality of channel structures comprise a plurality of nonlinear channel structures extending nonlinearly in the memory cell region in the vertical direction, and
the plurality of bit lines comprise a plurality of nonlinear bit lines arranged at a variable pitch in the memory cell region in the first horizontal direction and extending on the plurality of nonlinear channel structures in the second horizontal direction.

12. The integrated circuit device of claim 11, wherein the plurality of nonlinear bit lines comprise a curved portion that is convex toward the connection region.

13. The integrated circuit device of claim 11, further comprising
a plurality of bit line contact pads arranged between the plurality of nonlinear channel structures and the plurality of nonlinear bit lines to connect each of the plurality of nonlinear channel structures to a respective one of the plurality of nonlinear bit lines,
wherein the plurality of bit line contact pads are arranged at a variable pitch in the first horizontal direction.

14. The integrated circuit device of claim 11, wherein the plurality of nonlinear channel structures comprise:
a nonlinear channel structure connected to one of the plurality of bit lines; and
a nonlinear dummy channel structure that is not connected to any of the plurality of bit lines.

15. The integrated circuit device of claim 11, further comprising a plurality of dummy channel structures extending through at least some word lines of the plurality of word lines in the connection region in the vertical direction,
wherein a width of respective ones of the plurality of dummy channel structures is larger than that of respective ones of the plurality of nonlinear channel structures.

16. The integrated circuit device of claim 11, further comprising:
- a first dummy channel structure in the memory cell region that is not connected to any one of the plurality of bit lines; and
- a second dummy channel structure in the connection region that is not connected to any one of the plurality of bit lines,
- wherein the second dummy channel structure nonlinearly extends in the vertical direction.

17. An integrated circuit device, comprising
- a plurality of word lines extending parallel to a main surface of a substrate and overlapping each other in a vertical direction perpendicular to the main surface on the substrate,
- a common source line extending in a first horizontal direction on the substrate along one side of the plurality of word lines,
- a plurality of channel structures extending through the plurality of word lines in the vertical direction,
- a plurality of bit line contact pads on the plurality of channel structures, and
- a plurality of bit lines connected to the plurality of channel structures through the plurality of bit line contact pads,
- wherein the plurality of channel structures comprise a plurality of first channel structures extending linearly in the vertical direction and a plurality of second channel structures extending nonlinearly in the vertical direction, and
- the plurality of bit lines comprise a plurality of first bit lines extending linearly in a second horizontal direction perpendicular to the first horizontal direction and a plurality of second bit lines extending nonlinearly in the second horizontal direction.

18. The integrated circuit device of claim 17, wherein each of the plurality of first channel structures is connected to a respective one of the plurality of first bit lines, and each of the plurality of second channel structures is connected to respective ones of the plurality of second bit lines.

19. The integrated circuit device of claim 17, wherein, in the first horizontal direction, a first separation distance between two neighboring first bit lines of the plurality of first bit lines is smaller than a second separation distance between two neighboring second bit lines of the plurality of second bit lines.

20. The integrated circuit device of claim 17, wherein a first pair of neighboring second bit lines of the plurality of second bit lines is spaced apart by a first separation distance in the first horizontal direction,
- wherein a second pair of neighboring second bit lines of the plurality of second bit lines is spaced apart by a second separation distance, greater than the first separation distance, in the first horizontal direction, and
- wherein the second pair of neighboring second bit lines is farther from the plurality of first bit lines than the first pair of neighboring second bit lines.

* * * * *